United States Patent
Yahata et al.

(10) Patent No.: US 11,145,505 B1
(45) Date of Patent: Oct. 12, 2021

(54) METHOD OF MANUFACTURING SEMICONDUCTOR DEVICE, SUBSTRATE PROCESSING METHOD, SUBSTRATE PROCESSING APPARATUS, AND RECORDING MEDIUM

(71) Applicant: KOKUSAI ELECTRIC CORPORATION, Tokyo (JP)

(72) Inventors: Takashi Yahata, Toyama (JP); Naofumi Ohashi, Toyama (JP); Ryuji Yamamoto, Tokyo (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 17/206,024

(22) Filed: Mar. 18, 2021

(30) Foreign Application Priority Data

Feb. 15, 2021 (JP) .............................. JP2021-021417

(51) Int. Cl.
| | |
|---|---|
| *H01L 21/02* | (2006.01) |
| *C23C 16/52* | (2006.01) |
| *H01L 21/67* | (2006.01) |
| *H01J 37/32* | (2006.01) |
| *C23C 16/46* | (2006.01) |
| *C23C 16/50* | (2006.01) |

(52) U.S. Cl.
CPC ........ *H01L 21/02274* (2013.01); *C23C 16/46* (2013.01); *C23C 16/50* (2013.01); *C23C 16/52* (2013.01); *H01J 37/32449* (2013.01); *H01J 37/32715* (2013.01); *H01J 37/32743* (2013.01); *H01L 21/0214* (2013.01); *H01L 21/0217* (2013.01); *H01L 21/02167* (2013.01); *H01L 21/67017* (2013.01); *H01J 2237/2007* (2013.01); *H01J 2237/332* (2013.01)

(58) Field of Classification Search
None
See application file for complete search history.

(56) References Cited

U.S. PATENT DOCUMENTS

| | | | |
|---|---|---|---|
| 2004/0048493 A1* | 3/2004 | Matsuoka | ............... C23C 16/56 438/795 |
| 2012/0048180 A1 | 3/2012 | Ito et al. | |
| 2014/0273498 A1* | 9/2014 | Kobayashi | .......... C23C 16/4584 438/745 |

(Continued)

FOREIGN PATENT DOCUMENTS

| | | |
|---|---|---|
| JP | 2001-040480 A | 2/2001 |
| JP | 2002-129331 A | 5/2002 |

(Continued)

*Primary Examiner* — Asok K Sarkar
(74) *Attorney, Agent, or Firm* — Volpe Koenig

(57) ABSTRACT

There is provided a technique that includes: (a) loading a substrate into a process container; (b) heating the substrate by supplying a first gas, which is heated when passing through a first heater installed at a first gas supply line, to the substrate via a gas supplier; (c) supplying a second gas, which flows through a second gas supply line different from the first gas supply line, to the substrate mounted on a substrate mounting table in the process container, via the gas supplier; and (d) lowering a temperature of the gas supplier by supplying a third gas, which has a temperature lower than that of the first gas, to the gas supplier between (b) and (c).

23 Claims, 5 Drawing Sheets

(56) References Cited

U.S. PATENT DOCUMENTS

| | | | |
|---|---|---|---|
| 2014/0302687 A1* | 10/2014 | Ashihara | H01L 21/02271 |
| | | | 438/780 |
| 2015/0007770 A1 | 1/2015 | Chandrasekharan et al. | |
| 2015/0184288 A1* | 7/2015 | Sasaki | H01J 37/3244 |
| | | | 438/507 |
| 2017/0283949 A1 | 10/2017 | Yahata et al. | |
| 2018/0130695 A1* | 5/2018 | Kikumoto | H01L 21/68785 |
| 2020/0208267 A1* | 7/2020 | Kamio | C23C 16/06 |
| 2020/0211826 A1* | 7/2020 | Fujii | H01J 37/32724 |
| 2020/0370180 A1* | 11/2020 | Agarwal | C23C 16/45544 |
| 2021/0028029 A1* | 1/2021 | Mo | C23C 16/46 |

FOREIGN PATENT DOCUMENTS

| | | |
|---|---|---|
| JP | 2012-069904 A | 4/2012 |
| JP | 2015-015466 A | 1/2015 |
| JP | 2017-183575 A | 10/2017 |

\* cited by examiner

METHOD OF MANUFACTURING SEMICONDUCTOR DEVICE, SUBSTRATE PROCESSING METHOD, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2021-021417, filed on Feb. 15, 2021, the entire contents of which are incorporated herein by reference.

TECHNICAL FIELD

The present disclosure relates to a method of manufacturing a semiconductor device, a substrate processing method, a substrate processing apparatus, and a recording medium.

BACKGROUND

As a process of manufacturing a semiconductor device by using a single-wafer apparatus that processes substrates one by one, a step of supplying a gas to a substrate to form a film on the substrate may be often carried out.

SUMMARY

Some embodiments of the present disclosure provide a technique capable of improving a processing uniformity and a throughput for each substrate.

According to some embodiments of the present disclosure, there is provided a technique that includes: (a) loading a substrate into a process container; (b) heating the substrate by supplying a first gas, which is heated when passing through a first heater installed at a first gas supply line, to the substrate via a gas supplier; (c) supplying a second gas, which flows through a second gas supply line different from the first gas supply line, to the substrate mounted on a substrate mounting table in the process container, via the gas supplier; and (d) lowering a temperature of the gas supplier by supplying a third gas, which has a temperature lower than that of the first gas, to the gas supplier between (b) and (c).

BRIEF DESCRIPTION OF DRAWINGS

The accompanying drawings, which are incorporated in and constitute a part of the specification, illustrate some embodiments of the present disclosure.

DETAILED DESCRIPTION

Embodiments of the Present Disclosure

Some embodiments of the present disclosure will now be described mainly with reference to FIG. 1. Figures used in the following description are schematic, and dimensional relationships, ratios, and the like among elements on the figures do not always match actual ones. Further, dimensional relationships, ratios, and the like among elements on the figures do not always match each other even among a plurality of figures.

(1) Configuration of Substrate Processing Apparatus

Figure 1:
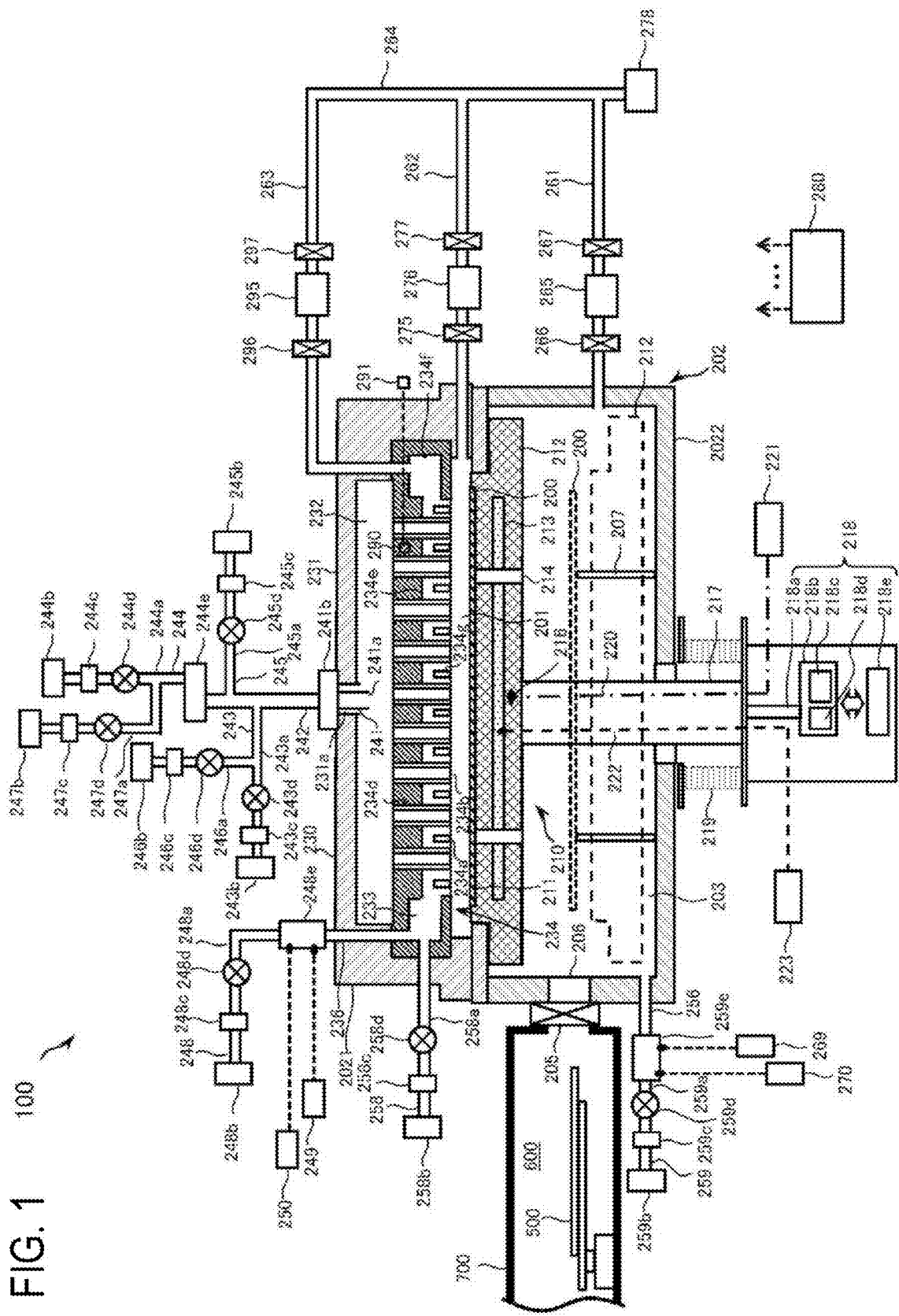
FIG. 1 is a schematic configuration view of a substrate processing apparatus suitably used in embodiments of the present disclosure, in which a portion of a process furnace is shown in a vertical cross section.

As shown in FIG. 1, a substrate processing apparatus 100 includes a process container 202. The process container 202 is configured as, for example, a flat sealed container having a circular cross section. The process container 202 includes an upper container 2021 made of, for example, a non-metal material such as quartz or ceramics, and a lower container 2022 made of, for example, a metal material such as aluminum (Al) or stainless steel (SUS). In the process container 202, a process chamber (process space) 201 in which a wafer 200 such as a silicon wafer as a substrate is processed is formed at an upper side (a space above a substrate mounting stand 212 as a substrate mounting table to be described below) of the process container 202, and a transfer chamber (transfer space) 203 configured to transfer the wafer 200 is formed in a space surrounded by the lower container 2022 on a lower side of the process container 202. A transfer container 700 is installed to be adjacent to the lower container 2022 of the process container 202. A transfer chamber (transfer space) 600 configured to transfer the wafer 200 is installed in the transfer container 700, and a transfer mechanism 500 such as a transfer robot is installed in the transfer chamber 600.

A substrate loading/unloading port 206 is installed at a side surface of the lower container 2022. The substrate loading/unloading port 206 is configured to be capable of being opened/closed by a gate valve 205. By opening the gate valve 205, an interior of the process container 202 (the transfer space 203) and an interior of the transfer container 700 (the transfer chamber 600) may be in fluid communication with each other such that the wafer 200 may be loaded/unloaded in/out of the transfer space 203 by the transfer mechanism 500. A plurality of lift pins 207 configured to temporarily support the wafer 200 are installed at a bottom portion of the lower container 2022.

A substrate support (susceptor) 210 configured to support the wafer 200 is installed at the process chamber 201. The substrate support 210 mainly includes a substrate mounting surface (substrate mounting plate) 211 on which the wafer 200 is mounted, a substrate mounting stand 212 having the substrate mounting surface 211 formed thereon, and a heater 213 as a second heating part included in the substrate mounting stand 212. The substrate support 210 further includes a temperature measurement terminal 216 configured to measure a temperature of the heater 213. The temperature measurement terminal 216 is connected to a temperature measuring part 221 via a wiring 220. The substrate mounting surface (substrate mounting plate) 211 may also be referred to as a susceptor.

The substrate mounting stand 212 is provided with through-holes 214 through which the lift pins 207 penetrate, at positions corresponding to the lift pins 207. A wiring 222 configured to supply electric power is connected to the heater 213. The wiring 222 is connected to a heater electric power controller 223.

The temperature measuring part 221 and the heater electric power controller 223 are connected to a controller 280 to be described below. The controller 280 transmits control information to the heater electric power controller 223 based on temperature information measured by the temperature measuring part 221. The heater electric power controller 223 controls the heater 213 based on the received control information.

The substrate mounting stand 212 is supported by a shaft 217. The shaft 217 penetrates the bottom portion of the process container 202 and is further connected to an elevator 218 outside the process container 202.

The elevator 218 mainly includes a support shaft 218a configured to support the shaft 217, and an actuator 218b configured to elevate and/or rotate the support shaft 218a. The actuator 218b includes, for example, an elevating mechanism 218c including a motor configured to perform an elevation, and a rotation mechanism 218d such as a gear configured to rotate the support shaft 218a. A smoothing agent such as grease is applied on the elevating mechanism 218c and the rotation mechanism 218d for their smooth operations. When there is no need to rotate the support shaft 218a, the rotation mechanism 218d may be omitted. In this case, the actuator 218b is configured to raise or lower the support shaft 218a.

The elevator 218 may include an instruction part 218e which is a part of the elevator 218 and configured to instruct the actuator 218b to perform the elevation and/or the rotation. In that case, the instruction part 218e is electrically connected to the controller 280. Further, in that case, the instruction part 218e controls the actuator 218b based on an instruction of the controller 280. As described below, the actuator 218b controls the elevating operation of the support shaft 218a such that the substrate mounting stand 212 moves to a wafer transfer position (a position of the substrate mounting stand 212 indicated by a broken line in FIG. 1) or a wafer processing position (a position of the substrate mounting stand 212 in FIG. 1).

By actuating the elevator 218 to raise or lower the shaft 217 and the substrate mounting stand 212, the substrate mounting stand 212 may raise or lower the wafer 200 mounted on the substrate mounting surface 211. A circumference of a lower end portion of the shaft 217 is covered with a bellows 219, whereby the interior of the process chamber 201 is kept airtight.

The substrate mounting stand 212 is lowered such that the substrate mounting surface 211 is at the position of the substrate loading/unloading port 206 (the wafer transfer position) when the wafer 200 is transferred, and is raised such that the wafer 200 is at the processing position (the wafer processing position) in the process chamber 201 when the wafer 200 is processed.

When the substrate mounting stand 212 is lowered to the wafer transfer position, the upper end portions of the lift pins 207 protrude from the upper surface of the substrate mounting surface 211 such that the lift pins 207 are in a state where the wafer 200 may be supported from below by the lift pins 207 (see the substrate mounting stand 212 indicated by the broken line and the wafer 200 indicated by a dotted line in FIG. 1). Further, when the substrate mounting stand 212 is raised to the wafer processing position with the wafer 200 supported by the lift pins 207, the lift pins 207 is buried from the upper surface of the substrate mounting surface 211 while the substrate mounting stand 212 is being raised, whereby the wafer 200 is supported from below by the substrate mounting surface 211 supports the wafer 200.

A shower head 230 as a gas distribution mechanism is installed at the upper portion of the process chamber 201 (an upstream side of gas flow) and at a position facing the substrate mounting surface 211. A lid 231 of the shower head 230 is made of, for example, electrically conductive and thermally conductive metal. In the following description, for convenience of description, the upstream side of the gas flow in a space where a gas may flow is also simply referred to as an upstream side. Further, in the following description, for convenience of description, a downstream side of gas flow in a space where a gas may flow is also simply referred to as a downstream side.

Further, the lid 231 of the shower head is provided with a through-hole 231a. A gas supply pipe 241 is inserted in the through-hole 231a. The gas supply pipe 241 inserted in the through-hole 231a includes a leading end 241a inserted in the shower head 230, and a flange 241b fixed to the lid 231. The gas supply pipe 241 has a function of distributing a gas supplied into a shower head buffer chamber 232 which is a space formed in the shower head 230. The leading end 241a of the gas supply pipe 241 is formed in, for example, a columnar shape and is provided with a distribution hole on a side surface of the columnar shape. A gas supplied from the gas supply pipe 241 is supplied into the shower head buffer chamber 232 via the distribution hole formed at the leading end 241a.

Further, the shower head 230 includes a gas supplier 234 configured to supply a gas supplied from a gas supply system to be described below, to the wafer 200. The shower head buffer chamber 232 is located at the upstream side of the gas supplier 234, and the process chamber 201 is located on the downstream side of the gas supplier 234. The gas supplier 234 is disposed on the upper side of the substrate mounting surface 211 to face the substrate mounting surface 211. The gas supplier 234 is provided with a plurality of through-holes 234b as a second gas supply port. Each of the through-holes 234b is constituted by a tubular structure (tubular portion) 234d. The tubular structure 234d is provided to penetrate an upper wall 234e of the gas supplier 234. The upstream side of the tubular structure 234d is in fluid communication with the shower head buffer chamber 232, and the downstream side of the tubular structure 234d is in fluid communication with the process chamber 201. Therefore, the shower head buffer chamber 232 is in fluid communication with the process chamber 201 via the plurality of through-holes 234b formed at the gas supplier 234.

A buffer space 233 is formed by a region constituting the gas supplier 234 and surrounded by the upper wall 234e facing the substrate mounting surface 211 and a side wall 234f. The buffer space 233 is configured as a part of the gas supplier 234.

The gas supplier 234 is provided with a plurality of through-holes 234a as a first gas supply port to be adjacent to the through-holes 234b. Each of the through-holes 234a is constituted by a tubular structure (tubular portion) 234g. The tubular structure 234g is installed to protrude into the buffer space 233. The upstream side of the tubular structure 234g is in fluid communication with the buffer space 233, and the downstream side of the tubular structure 234g is in fluid communication with the process chamber 201. Therefore, the buffer space 233 is in fluid communication with the process chamber 201 via the plurality of through-holes 234a formed at the gas supplier 234.

A common gas supply pipe 242 is connected to the gas supply pipe 241 inserted in the through-hole 231a. Interiors of the gas supply pipe 241 and the common gas supply pipe 242 are in fluid communication with each other. According to the aforementioned configuration, a gas supplied from the common gas supply pipe 242 is supplied into the shower head 230 via the gas supply pipe 241 and the through-hole 231a.

Gas supply pipes 243a, 244a, and 245a are connected to the common gas supply pipe 242. Among them, the gas supply pipe 244a is connected to the common gas supply pipe 242 via a remote plasma unit (RPU) 244e as a plasma generator (plasma source).

At the gas supply pipes 243a, 244a, and 245a, gas supply sources 243b, 244b, and 245b, MFCs (Mass Flow Controllers) 243c, 244c, and 245c, which are flow rate controllers, and valves 243d, 244d, and 245d, which are opening/closing valves, are installed sequentially from the upstream side of gas flow, respectively.

Downstream ends of gas supply pipes 246a and 247a are connected to the gas supply pipes 243a and 244a at the downstream side of the valves 243d and 244d, respectively. At the gas supply pipes 246a and 247a, gas supply sources 246b and 247b, MFCs 246c and 247c, and valves 246d and 247d as opening/closing valves are respectively installed sequentially from the upstream side of gas flow. The gas supply pipes 243a to 247a are made of, for example, a metal material such as SUS.

A precursor gas is supplied from the gas supply source 243b into the shower head 230 via the MFC 243c, the valve 243d, the gas supply pipe 243a, the common gas supply pipe 242, the gas supply pipe 241, and the through-hole 231a.

A reaction gas is supplied from the gas supply source 244b into the shower head 230 via the MFC 244c, the valve 244d, the gas supply pipe 244a, the RPU 244e, the common gas supply pipe 242, the gas supply pipe 241, and the through-hole 231a. At this time, the reaction gas is excited into a plasma state by the RPU 244e and is supplied to the wafer 200 in the process chamber 201 via the common gas supply pipe 242, the gas supply pipe 241, the through-hole 231a, and the shower head 230.

An inert gas and a cleaning gas are supplied from the gas supply source 245b into the shower head 230 via the MFC 245c, the valve 245d, the gas supply pipe 245a, the common gas supply pipe 242, the gas supply pipe 241, and the through-hole 231a. The inert gas is mainly supplied from the gas supply source 245b when the wafer 200 is processed, and the cleaning gas is mainly supplied from the gas supply source 245b when the interior of the shower head 230 and the interior of the process chamber 201 are cleaned. The inert gas acts as a purge gas that purges a retained gas or a residual gas in the process container 202 (the process chamber 201) and in the shower head 230. In addition, the inert gas may also act as a dilution gas that dilutes each gas or as a carrier gas that promotes the flow of each gas. As the cleaning gas, a halogen-based gas, for example, a fluorine (F)-containing gas or the like, may be used.

An inert gas is supplied from the gas supply source 246b into the shower head 230 via the MFC 246c, the valve 246d, the gas supply pipe 246a, the common gas supply pipe 242, the gas supply pipe 241, and the through-hole 231a. The inert gas acts as a purge gas, a carrier gas, a dilution gas, or the like.

An inert gas is supplied from the gas supply source 247b into the shower head 230 via the MFC 247c, the valve 247d, the gas supply pipe 247a, the RPU 244e, the common gas supply pipe 242, the gas supply pipe 241, and the through-hole 231a. The inert gas acts as a purge gas, a carrier gas, a dilution gas, or the like.

A precursor gas supply system 243 mainly includes the gas supply pipe 243a, the MFC 243c, and the valve 243d. The gas supply source 243b may be included in the precursor gas supply system 243. A first inert gas supply system mainly includes the gas supply pipe 246a, the MFC 246c, and the valve 246d. The gas supply source 246b may be included in the first inert gas supply system. A reaction gas supply system 244 mainly includes the gas supply pipe 244a, the MFC 244c, and the valve 244d. The gas supply source 244b may be included in the reaction gas supply system 244. A second inert gas supply system mainly includes the gas supply pipe 247a, the MFC 247c, and the valve 247d. The gas supply source 247b may be included in the second inert gas supply system. A gas supply system 245 mainly includes the gas supply pipe 245a, the MFC 245c, and the valve 245d. The gas supply source 245b may be included in the gas supply system 245.

Further, the first inert gas supply system, the gas supply pipe 241, and the common gas supply pipe 242 may be included in the precursor gas supply system 243. Further, the second inert gas supply system, the RPU 244e, the gas supply pipe 241, and the common gas supply pipe 242 may be included in the reaction gas supply system 244.

Each or both of the precursor gas and the reaction gas are also referred to as a processing gas or a second gas, and each or both of the precursor gas supply system 243 and the reaction gas supply system 244 are also referred to as a processing gas supply system, a second gas supply system, or a second gas supply line. Since the inert gas is a non-reactive gas and the processing gas (precursor gas or reaction gas) is a reactive gas, the processing gas may also be referred to as a reactive gas. Further, when a film is formed by the processing gas, the processing gas may also be referred to as a film-forming gas.

A gas introduction hole configured to supply a gas into the buffer space 233 is formed at the upper wall 234e of the gas supplier 234. A gas supply pipe 236 is connected to this gas introduction hole. A gas supply pipe 248a is connected to the gas supply pipe 236, and a gas supply source 248b, a MFC 248c, a valve 248d, and a heater 248e as a first heating part are installed at the gas supply pipe 248a sequentially from the upstream side of gas flow.

A first gas is supplied from the gas supply source 248b into the buffer space 233 via the MFC 248c, the valve 248d, the gas supply pipe 248a, the heater 248e, the gas supply pipe 236, and the like. The heater 248e is configured to be capable of heating the first gas, which passes through the heated 248e, to a predetermined temperature according to an instruction of the controller 280. Hereinafter, as a matter of convenience, a gas heated in this manner is also referred to as a heating gas. As the first gas, for example, at least one selected from the group of an inert gas such as a nitrogen ($N_2$) gas and a helium (He) gas and a hydrogen ($H_2$) gas may be used. In the embodiments, a case where, for example, an inert gas is used as the first gas will be described.

A first gas supply system 248 mainly includes the gas supply pipe 248a, the MFC 248c, and the valve 248d. The gas supply source 248b, the heater 248e, and the gas supply pipe 236 may be included in the first gas supply system 248. The first gas supply system 248 is also referred to as a first gas supply line.

A temperature measuring part 249 configured to measure the temperature of the heater 248e is installed at the heater 248e. Further, a heater controller 250 configured to control the heater 248e is connected to the heater 248e. The heater 248e is controlled by the controller 280 via the heater controller 250.

A gas introduction hole configured to supply a gas into the buffer space 233 at the side wall 234f of the gas supplier 234. A gas supply pipe 258a is connected to this gas introduction hole. A gas supply source 258b, a MFC 258c, and a valve 258d are installed at the gas supply pipe 258a sequentially from the upstream side of gas flow.

A third gas is supplied from the gas supply source 258b into the buffer space 233 via the MFC 258c, the valve 258d, the gas supply pipe 258a, and the like. As the third gas, for example, at least one selected from the group of an inert gas such as a $N_2$ gas or a He gas, a $H_2$ gas, a diluted $H_2$ gas, and an activated $H_2$ gas may be used. In the embodiments, a case where, for example, an inert gas is used as the third gas will be described.

A third gas supply system 258 mainly includes the gas supply pipe 258a, the MFC 258c, and the valve 258d. The gas supply source 258b may be included in the third gas supply system 258. The third gas supply system 258 is also referred to as a third gas supply line.

A gas introduction hole configured to supply a gas into the transfer space 203 is formed at the side surface of the lower container 2022. A gas supply pipe 256 is connected to this gas introduction hole. A gas supply pipe 259a is connected to the gas supply pipe 256. A gas supply source 259b, a MFC 259c, a valve 259d, and a heater 259e as a fourth heating part are installed at the gas supply pipe 259a sequentially from the upstream side of gas flow.

A fourth gas is supplied from the gas supply source 259b into the transfer space 203 via the MFC 259c, the valve 259d, the gas supply pipe 259a, the heater 259e, the gas supply pipe 256, and the like. As the fourth gas, for example, at least one selected from the group of an inert gas such as a $N_2$ gas and a He gas, a $H_2$ gas, a diluted $H_2$ gas, and an activated $H_2$ gas may be used. In the embodiments, a case where, for example, an inert gas is used as the fourth gas will be described. The heater 259e is configured to be capable of heating the inert gas, which passes through the heater 259e, to a predetermined temperature according to an instruction of the controller 280.

A fourth gas supply system 259 mainly includes the gas supply pipe 259a, the MFC 259c, and the valve 259d. The gas supply source 259b, the heater 259e, and the gas supply pipe 256 may be included in the fourth gas supply system 259. The fourth gas supply system 259 is also referred to as a fourth gas supply line.

An exhauster configured to exhaust an internal atmosphere of the process container 202 includes a plurality of exhaust pipes connected to the process container 202. Specifically, the exhauster includes an exhaust pipe 261 connected to the transfer space 203, an exhaust pipe 262 connected to the process chamber 201, and an exhaust pipe 263 connected to the buffer space 233. Further, an exhaust pipe 264 is connected to each of the downstream ends of the exhaust pipes 261, 262, and 263.

An exhaust hole configured to exhaust an internal atmosphere of the transfer space 203 is formed at the side surface of the lower container 2022. The exhaust pipe 261 is connected to this exhaust hole. A TMP (Turbo Molecular Pump) 265, which is a vacuum pump that realizes a high vacuum or an ultra-high vacuum, is connected to the exhaust pipe 261. Valves 266 and 267, which are opening/closing valves, are installed at the upstream side and the downstream side of the TMP 265 in the exhaust pipe 261, respectively.

An exhaust hole configured to exhaust an internal atmosphere of the process chamber 201 is formed at the side of the process chamber 201. The exhaust pipe 262 is connected to this exhaust hole. An APC (Auto Pressure Controller) 276, which is a pressure controller configured to control the interior of the process chamber 201 to a predetermined pressure, is installed at the exhaust pipe 262. The APC 276 includes a valve body whose opening degree may be adjusted, and is configured to be capable of adjusting an internal conductance of the exhaust pipe 262 by adjusting the opening degree of the valve body according to an instruction from the controller 280. Further, valves 275 and 277, which are opening/closing valves, are installed at the exhaust pipe 262 on the upstream side and the downstream side of the APC 276 respectively.

An exhaust hole configured to exhaust an internal atmosphere of the buffer space 233 is formed at the upper wall 234e of the gas supplier 234. The exhaust pipe 263 is connected to this exhaust hole. A TMP 295 is installed at the exhaust pipe 263. Valves 296 and 297, which are opening/closing valves, are installed at the exhaust pipe 263 on the upstream side and the downstream side of the TMP 295, respectively.

A DP (Dry Pump) 278 is connected to the exhaust pipe 264. More specifically, the exhaust pipes 263, 262, and 261 are connected to the exhaust pipe 264 at the upstream side thereof, and the DP 278 is connected to the exhaust pipe 264 at the downstream side thereof. The DP 278 exhausts the atmospheres of the buffer space 233, the process chamber 201, and the transfer space 203 via the exhaust pipes 263, 262, and 261, respectively. The DP 278 also functions as an auxiliary pump when the TMPs 265 and 295 operate. That is, since it is difficult for the TMPs 265 and 295, which are a high vacuum (or ultra-high vacuum) pumps, to perform an exhaust alone up to the atmospheric pressure, the DP 278 is used as an auxiliary pump configured to perform the exhaust up to the atmospheric pressure.

As shown in FIG. 1, the substrate processing apparatus 100 includes the controller 280 configured to control operations of various parts of the substrate processing apparatus 100.

Figure 2:
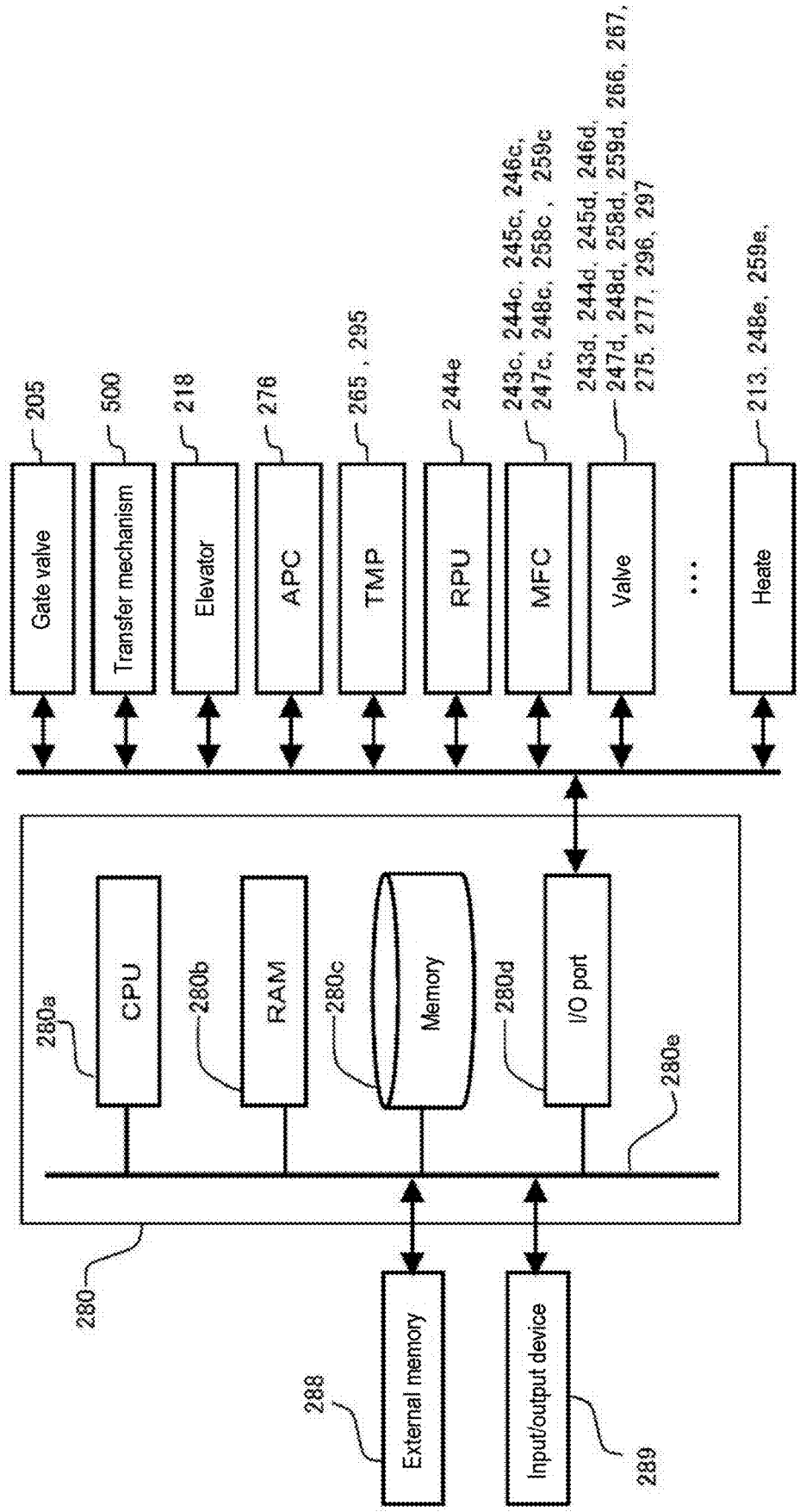
FIG. 2 is a schematic configuration diagram of a controller 280 of a substrate processing apparatus suitably used in some embodiments of the present disclosure, in which a control system of the controller 280 is shown in a block diagram.

As shown in FIG. 2, the controller 280, which is a controller (control means), may be configured as a computer including a CPU (Central Processing Unit) 280a, a RAM (Random Access Memory) 280b, a memory 280c, and an I/O port 280d. The RAM 280b, the memory 280c, and the I/O port 280d are configured to be capable of exchanging data with the CPU 280a via an internal bus 280e. An input/output device 289 configured as, for example, a touch panel and the like or an external memory 288, may be connected to the controller 280.

The memory 280c includes, for example, a flash memory, a HDD (Hard Disk Drive), a SSD (Solid State Drive), or the like. A control program configured to control operations of the substrate processing apparatus 100, a process recipe in which sequences, conditions, and the like of substrate processing to be described below are written, and the like are readably stored in the memory 280c. The process recipe functions as a program configured to allow the controller 280 to cause the substrate processing apparatus 100 to execute each sequence in the substrate processing to be described below, to obtain an expected result. Hereinafter, the process recipe and the control program may be generally and simply referred to as a "program." Furthermore, the process recipe may be simply referred to as a "recipe." When the term "program" is used herein, it may indicate a case of including the recipe only, a case of including the control program only, or a case of including both the recipe and the control program. The RAM 280b is configured as a memory area (work area) in which a program or data read by the CPU 280a is temporarily stored.

The I/O port 280d is connected to the gate valve 205, the transfer mechanism 500, the elevator 218, the APC 276, the TMPs 265 and 295, the DP 278, the RPU 244e, the MFCs 243c, 244c, 245c, 246c, 247c, 248c, 258c, and 259c, the valves 243d, 244d, 245d, 246d, 247d, 248d, 258d, 259d, 266, 267, 275, 277, 296, and 297, the heaters 213, 248e, and 259e, and the like.

The CPU 280a is configured to read and execute the control program from the memory 280c. The CPU 280a is also configured to be capable of reading the recipe from the memory 280c according to an input of an operation command from the input/output device 289. The CPU 280a is configured to control the opening/closing operation of the gate valve 205, the transferring operation of the wafer 200 by the transfer mechanism 500, the elevating operation of the substrate mounting stand 212 by the elevator 218, the adjusting operation of the internal pressure of the process chamber 201 by the APC 276, the on/off control of the TMPs 265 and 295, the on/off control of the DP 278, the on/off control of plasma by the RPU 244e, the flow rate regulating operation of various types of gases by the MFCs 243c, 244c, 245c, 246c, 247c, 248c, 258c, and 259c, the opening/closing control of the valves 243d, 244d, 245d, 246d, 247d, 248d, 258d, 259d, 266, 267, 275, 277, 296, and 297, the on/off control and the temperature regulating operation of the heaters 213, 248e, and 259e, and the like, according to contents of the read recipe.

The controller 280 may be configured by installing, on the computer, the aforementioned program stored in the external memory 288. Examples of the external memory 288 may include a magnetic disk such as a HDD, an optical disc such as a CD, a magneto-optical disc such as a MO, a semiconductor memory such as a USB memory or a SSD, and the like. The memory 280c or the external memory 288 is configured as a computer-readable recording medium. Hereinafter, the memory 280c and the external memory 288 may be generally and simply referred to as a "recording medium." When the term "recording medium" is used herein, it may indicate a case of including the memory 280c only, a case of including the external memory 288 only, or a case of including both the memory 280c and the external memory 288. Furthermore, the program may be provided to the computer by using a communication means such as the Internet or a dedicated line, instead of using the external memory 288.

(2) Substrate Processing

As a process of manufacturing a semiconductor device by using the above-described substrate processing apparatus 100, a processing sequence of forming a thin film on a wafer 200 as a substrate in a process container 202 will be described. In the following description, the operations of various parts constituting the substrate processing apparatus 100 are controlled by the controller 280.

A processing sequence in some embodiments includes:

a step a of loading the wafer 200 into the process container 202;

a step b of heating the wafer 200 by supplying a first gas, which is heated when passing through a heater 248e installed at a first gas supply system 248, to the wafer 200 via a gas supplier 234;

a step c of supplying a second gas, which flows through a second gas supply system different from the first gas supply system 248, to the wafer 200 mounted on a substrate mounting stand 212 in the process container 202, via the gas supplier 234; and a step d of lowering the temperature of the gas supplier 234 by supplying a third gas, which has a temperature lower than that of the first gas, to the gas supplier 234 between the step b and the step c.

The processing sequence in the embodiments further includes, as an example, before the step c, a step e of holding the wafer 200 in a state of being mounted on the substrate mounting stand 212, and heating the wafer 200 from a rear surface side by heat conduction from the substrate mounting stand 212 heated by the heater 213.

The processing sequence in the embodiments further includes, as an example, before the step a, a step f of heating the gas supplier 234 by radiation (also referred to as emission) from the substrate mounting stand 212 heated by the heater 213. When the substrate mounting stand 212 is made of quartz, ceramics, or the like capable of transmitting light (electromagnetic waves), radiation from the heater 213 transmits through the substrate mounting stand 212 and is delivered to the gas supplier 234 such that the gas supplier 234 may be heated. Therefore, in this case, the gas supplier 234 is heated by the radiation from the heater 213, the radiation from the substrate mounting stand 212 heated by the heater 213, and the like.

The processing sequence in the embodiments further includes, as an example, between the step a and the step b, a step g of heating the wafer 200 by supplying a fourth gas, which is heated when passing through a heater 259e installed at a fourth gas supply system 259, to the wafer 200 in a state where the wafer 200 is accommodated in a transfer space 203 installed in the process container 202.

The processing sequence in the embodiments further includes, as an example, after the step c, a step h of cooling the wafer 200 by supplying the third gas to the wafer 200.

In the following, an example of forming a nitride film as a film will be described. Here, the nitride film includes not only a silicon nitride film (SiN film) but also a nitride film containing carbon (C), oxygen (O), boron (B), or the like. That is, the nitride film includes a silicon nitride film (SiN film), a silicon carbonitride film (SiCN film), a silicon oxynitride film (SiON film), a silicon oxycarbonitride film (SiOCN film), a silicon borocarbonitride film (SiBCN film)), a silicon boronitride film (SiBN film), a silicon oxyborocarbonitride film (SiBOCN film), a silicon oxyboronitride film (SiBON film), and the like. Hereinafter, an example of forming a SiN film as a nitride film will be described.

In the following, as described above, each of the precursor gas and the reaction gas may be referred to as the second gas. Further, in the following, in the step b, an example of performing a cycle a predetermined number of times (m times, where m is an integer of 1 or more), the cycle including a step of supplying the precursor gas to the wafer 200 and a step of supplying the reaction gas to the wafer 200, will be described. The step of supplying the precursor gas and the step of supplying the reaction gas may be performed alternately, that is, non-simultaneously, or these steps may be performed simultaneously. In the following, an example of performing these steps alternately will be described. In the present disclosure, as a matter of convenience, such a gas supply sequence may be represented as follows. The same notation is used in other embodiments, modifications, and the like to be described below.

(Precursor gas→reaction gas)×$m$

When the term "wafer" is used in the present disclosure, it may refer to "a wafer itself" or "a laminated body of a wafer and certain layers or films formed on a surface of the wafer." When the phrase "a surface of a wafer" is used in the present disclosure, it may refer to "a surface of a wafer itself" or "a surface of a certain layer and the like formed on a wafer." When the expression "a certain layer is formed on a wafer" is used in the present disclosure, it may mean that "a certain layer is formed directly on a surface of a wafer itself" or that "a certain layer is formed on a layer and the like formed on a wafer." When the term "substrate" is used in the present disclosure, it is synonymous with the term "wafer."

(Gas Supplier Heating Step: Step f)

The heaters 213, 248e, and 259e are turned on, and heating and temperature control of an object by the heaters 213, 248e, and 259e are started. Here, set temperatures of the heaters 248e and 259e are set to a temperature in the range of, for example, 50 to 500 degrees C., specifically 100 to 400 degrees C. Further, the set temperature of the heater 213 is set to a temperature in the range of, for example, 10 to 500 degrees C., specifically 20 to 300 degrees C. After the temperatures of the heaters 213, 248e, and 259e are stabilized, the substrate mounting stand 212 is lowered to the transfer position (wafer transfer position) of the wafer 200, and the lift pins 207 are passed through the through-holes 214 of the substrate mounting stand 212. In parallel with this operation, the internal atmosphere of the transfer space 203 is exhausted such that the internal pressure of the transfer space 203 becomes equal to or lower than the internal pressure of the transfer chamber 600. At this time, the gas supplier 234 is in a state of being heated from below by radiation from the heater 213, radiation from the substrate mounting stand 212 heated by the heater 213, and the like. Since the gas supplier 234 has a large heat capacity and therefore it takes time for the gas supplier 234 to be heated, the gas supplier 234 may be pre-heated in this way before the step a to be described below. Further, in the step f, raised temperatures of the heaters 213, 248e, and 259e are maintained in each step to be described below. Further, a distance between the gas supplier 234 and the substrate mounting stand 212 in the step f may be smaller (shorter) than a distance between the gas supplier 234 and the substrate mounting stand 212 in the step c to be described below. When the distance between the gas supplier 234 and the substrate mounting stand 212 is shortened, a structure is configured such that an outer peripheral side of the substrate mounting stand 212 shown in FIG. 1 and members in the process container 202 do not come into contact with each other. Further, in the step f, the inert gas, the first gas, and the fourth gas may be supplied from the gas supply system 245, the first gas supply system 248, and the fourth gas supply system 259 into the process chamber 201 and the transfer space 203, respectively. Further, in the step f, the heaters 248e or the heater 259e may be turned off. For example, the heater 248e is turned on and the heater 259e is turned off.

(Substrate Loading Step: Step a)

Subsequently, the gate valve 205 is opened such that the interior of the transfer space 203 is in fluid communication with the interior of the transfer chamber 600. Then, the wafer 200 is loaded from the transfer chamber 600 into the transfer space 203 by using the transfer mechanism 500 installed in the transfer chamber 600.

(Substrate Heating Step: Step g)

Then, the inert gas, the first gas, and the fourth gas are supplied from the gas supply system 245, the first gas supply system 248, and the fourth gas supply system 259 into the process chamber 201 and the transfer space 203, respectively. In parallel with this, the internal atmospheres of the process chamber 201 and the transfer space 203 are exhausted via the exhaust pipe 261. The first gas and the fourth gas supplied from the first gas supply system 248 and the fourth gas supply system 259 are heated by the heaters 248e and 259e, supplied into the process chamber 201 and the transfer space 203, respectively, and are exhausted via the exhaust pipe 261. At this time, the heated first gas and fourth gas are supplied to the wafer 200 in the transfer space 203, and these gases come into contact with the wafer 200. In this way, the wafer 200 in the transfer space 203 is heated (pre-heated). Here, set temperatures of the heaters 248e and 259e when heating the wafer 200 are set to a temperature in the range of, for example, 50 to 500 degrees C., specifically 100 to 400 degrees C. in some embodiments. The step g may not be performed and may be omitted. For example, when it is desired to shorten a time needed to heat (pre-heat) the wafer 200, the step g may be performed before the step b. Further, a supply amount (supply flow rate) of the inert gas from the gas supply system 245 may be a supply amount (supply flow rate) by which other gases may be prevented from penetrating from the process chamber 201 into the gas supply system 245.

(Substrate Heating/Substrate Radiation Heating Step: Step b)

The wafer 200 can be placed on the lift pins 207 by loading the wafer 200 into the transfer space 203 by the transfer mechanism 500, holding the wafer 200 over the lift pins 207, and then lowering the transfer mechanism 500 to mount the wafer 200 on the lift pins 207. Then, the transfer mechanism 500 is moved out of the transfer space 203, and the substrate loading/unloading port 206 is closed by the gate valve 205. As a result, the wafer 200 may be held on the lift pins 207 in the transfer space 203.

In the step b, the supply of the inert gas from the gas supply system 245 is continued following the step g. However, after the substrate loading/unloading port 206 is closed by the gate valve 205, the supply of the inert gas from the gas supply system 245 is stopped.

Further, in the step b, following the step g, the supply of the first gas and the supply of the fourth gas from the first gas supply system 248 and the fourth gas supply system 259 to the wafer 200 in the transfer space 203 are continued, respectively. Further, the exhaust of the internal atmospheres of the process chamber 201 and the transfer space 203 from the exhaust pipe 261 are continued.

Specifically, in the step b, the valves 248d and 259d are maintained in the opened state, such that the first gas and the fourth gas flow through the gas supply pipes 248a and 259a, respectively. Flow rates of the first gas and the fourth gas are regulated by the MFCs 248c and 259c, and the first gas and the fourth gas are heated by the heaters 248e and 259e, respectively. Then, the first gas and the fourth gas are supplied into the process chamber 201 and the transfer space 203 via the gas supply pipes 236 and 256, respectively, and are exhausted via the exhaust pipe 261. At this time, the heated first gas and fourth gas are supplied to the wafer 200 in the transfer space 203, and these gases come into contact with the wafer 200. In this way, the wafer 200 in the transfer space 203 is heated. Here, the set temperatures of the heaters 248e and 259e when heating the wafer 200 is set to a temperature in the range of, for example, 50 to 500 degrees C., specifically 100 to 400 degrees C.

Processing conditions in the step b are exemplified as follows.

Processing temperature: 10 to 500 degrees C., specifically 20 to 300 degrees C. in some embodiments Processing pressure: 10 to 13,333 Pa, specifically 100 to 10,000 Pa in some embodiments First gas supply flow rate: 0.0001 to 100 slm, specifically 0.001 to 10 slm in some embodiments First gas supply time: 1 to 300 seconds, specifically 5 to 60 seconds in some embodiments Fourth gas supply flow rate: 0.0001 to 100 slm, specifically 0.001 to 5 slm in some embodiments Fourth gas supply time: 0.1 to 300 seconds, specifically 5 to 60 seconds in some embodiments Inert gas supply flow rate: 0.0001 to 100 slm, specifically 0.001 to 5 slm in some embodiments Inert gas supply time: 0.1 to 150 seconds, specifically 2 to 30 seconds in some embodiments The processing temperature shown here means the temperature of the wafer 200, that is, a pre-heating target temperature of the wafer 200.

The notation of a numerical range such as "10 to 500 degrees C." in the present disclosure means that a lower limit value and an upper limit value are included in the numerical range. Therefore, for example, "10 to 500 degrees C." means "10 degrees C. or higher and 500 degrees C. or lower." The same applies to other numerical ranges. Further, in the present disclosure, the processing temperature means the temperature of the wafer 200 or the internal temperature of the process chamber 201, and the processing pressure means the internal pressure of the process chamber 201. Further, the gas supply flow rate of 0 slm means a case where no gas is supplied. The same applies to the following description.

Examples of the first gas, the fourth gas, and the inert gas may include rare gases such as a nitrogen ($N_2$) gas, an argon (Ar) gas, a helium (He) gas, a neon (Ne) gas, and a xenon (Xe) gas. One or more of these gases may be used as the first gas, the fourth gas, and the inert gas. The type of gas when the inert gas is used in each of the other steps may be the same as the type of gas described here.

The first gas supplied from the first gas supply system 248 in the step b is heated by the heater 248e, supplied to the wafer 200 via the buffer space 233 (the gas supplier 234), and comes into contact with the surface of the wafer 200. In this way, the wafer 200 is heated from above (front surface side). Further, since the wafer 200 is mounted on the lift pins 207 and is held in a floating state without being mounted on the substrate mounting stand 212, it is heated by radiation from the heater 213 included in the substrate mounting stand 212, radiation from the substrate mounting stand 212 heated by the heater 213, and the like. In this way, the wafer 200 is also heated from below (rear surface side). Further, since the wafer 200 is mounted on the lift pins 207, the fourth gas supplied from the fourth gas supply system 259 and heated by the heater 259e also infiltrates a space between the wafer 200 and the substrate mounting stand 212 and comes into contact with the rear surface of the wafer 200. In this way, the wafer 200 is further heated from below (rear surface side). As a result, the wafer 200 is heated from both the front and rear sides. Further, at this time, the gas supplier 234 is also heated from below by radiation from the heater 213, radiation from the substrate mounting stand 212 heated by the heater 213, radiation from the heated wafer 200, and the like.

(Substrate Heat Conduction Heating Step: Step e)

Subsequently, the substrate mounting stand 212 is raised, the wafer 200 mounted on the lift pins 207 is picked up by the substrate mounting stand 212, the wafer 200 is mounted on the substrate mounting surface 211, and the substrate mounting stand 212 is raised to the processing position of the wafer 200 (wafer processing position) shown in the figure. At least until the wafer 200 moves from the wafer transfer position to the wafer processing position, the supply of the heated first gas from the first gas supply system 248 is continuously maintained, and the wafer 200 is heated from above (front surface side). At this time, the supply of the heated fourth gas from the fourth gas supply system 259 is also maintained. Further, at this time, since the wafer 200 is mounted on the substrate mounting surface 211, the wafer 200 is heated from below (rear surface side) by heat conduction from the substrate mounting stand 212 heated by the heater 213.

(Gas Supplier Cooling Step: Step d)

After performing the step b and before performing the step c (film-forming process) to be described below, the third gas having a temperature lower than that of the first gas is supplied from the third gas supply system 258 into the buffer space 233.

Specifically, the valve 258d is opened to allow the third gas to flow through the gas supply pipe 258a. A flow rate of the third gas is regulated by the MFC 258c, and the third gas is supplied into the buffer space 233 and then is exhausted via the exhaust pipe 263. At this time, the third gas diffuses in the buffer space 233, and the third gas diffused in the buffer space 233 comes into contact with the upper wall 234e and the side wall 234f constituting the buffer space 233.

Processing conditions in the step b are exemplified as follows.

Processing temperature: 50 to 1,000 degrees C., specifically 300 to 600 degrees C. in some embodiments Processing pressure: 10 to 13,333 Pa, specifically 20 to 1,000 Pa in some embodiments Third gas supply flow rate: 0.0001 to 100 slm, specifically 0.001 to 10 slm in some embodiments Third gas supply time: 0.1 to 300 seconds, specifically 1 to 60 seconds in some embodiments The processing temperature here means the temperature of the wafer 200, that is, the temperature of the wafer 200 when the step d is performed after going through the step g, the step b, and the step e, and may be a temperature close to the processing temperature in the step c (film-forming process) to be described below or the same temperature as in the step c.

The temperature of the gas supplier 234 may be lowered by supplying the third gas having the temperature lower than that of the first gas into the buffer space 233 under the aforementioned processing conditions. As a result, in the step c (film-forming process) to be described below, it is possible to prevent the second gas from being excessively heated by the gas supplier 234 to cause unexpected decomposition or the like. Here, the temperature of the gas supplier 234 is lowered to fall within a temperature range such that the characteristics of the second gas do not change significantly. The lower limit of the temperature range may be a temperature at which aggregation, liquefaction (solidification), and the like of the second gas are unlikely to occur. The upper limit of the temperature range may be a temperature at which decomposition of the second gas is unlikely to occur. For example, in the step d, the gas supplier 234 may be cooled to a temperature within the range of 100 to 600 degrees C., specifically 200 to 400 degrees C. By cooling the gas supplier 234 to such a temperature, it is possible to prevent the characteristics (reactivity) of the second gas from changing greatly due to unexpected decomposition, aggregation, liquefaction (solidification), and the like.

Further, in the step d, in parallel with the supply of the third gas into the buffer space 233, the internal atmosphere of the buffer space 233 may be exhausted via the exhaust pipe 263 in some embodiments. As a result, it is possible to avoid the third gas of low temperature from being supplied to the pre-heated wafer 200, thereby preventing the temperature of the pre-heated wafer 200 from being lowered.

(Film-Forming Process: Step c)

Then, as the step c, the following steps c1 and c2 are sequentially performed.

[Step c1]

In a step c1, the precursor gas as the second gas is supplied to the wafer 200 in the process chamber 201.

Specifically, the valve 243d is opened to allow the precursor gas to flow through the gas supply pipe 243a. A flow rate of the precursor gas is regulated by the MFC 243c, and the precursor gas is supplied into the process chamber 201 via the common gas supply pipe 242, the gas supply pipe 241, the shower head buffer chamber 232, and the gas supplier 234 (the through-holes 234b) and is exhausted via the exhaust pipe 262. In this operation, the precursor gas is supplied to the wafer 200 (precursor gas supply). At this time, the valves 246d and 247d may be opened to allow an inert gas to be supplied from each of the gas supply pipes 246a and 247a into the process chamber 201.

Processing conditions in the step c1 are exemplified as follows.

Processing temperature: 50 to 1,000 degrees C., specifically 300 to 800 degrees C. in some embodiments Processing pressure: 10 to 1,000 Pa, specifically 20 to 100 Pa in some embodiments Precursor gas supply flow rate: 0.0001 to 100 slm, specifically 0.001 to 10 slm in some embodiments Precursor gas supply time: 0.1 to 120 seconds, specifically 1 to 60 seconds, more specifically 1 to 30 seconds in some embodiments Inert gas supply flow rate (for each gas supply pipe): 0 to 100 slm, specifically 0.0001 to 20 slm, more specifically 0.01 to 10 slm in some embodiments By supplying the precursor gas, for example, a chlorosilane-based gas, to the wafer 200 under the aforementioned processing conditions, a Si-containing layer containing Cl is formed on the outermost surface of the wafer 200 as a base. The Si-containing layer containing Cl is formed by physical adsorption or chemical adsorption of molecules of the chlorosilane-based gas, physical adsorption or chemical adsorption of molecules of a substance obtained by partially decomposing the chlorosilane-based gas, deposition of Si due to thermal decomposition of the chlorosilane-based gas, and the like on the outermost surface of the wafer 200. The Si-containing layer containing Cl may be an adsorption layer (physical adsorption layer or chemical adsorption layer) of molecules of the chlorosilane-based gas or molecules of a substance obtained by partially decomposing the chlorosilane-based gas or may be a deposition layer of Si containing Cl. In the present disclosure, the Si-containing layer containing Cl is also simply referred to as a Si-containing layer.

After the Si-containing layer is formed, the valve 243d is closed to stop the supply of the precursor gas into the process chamber 201. Then, the interior of the process chamber 201 is vacuum-exhausted to remove a gas or the like remaining in the process chamber 201 from the process chamber 201 (purge). At this time, the valve 245d may be opened to allow an inert gas to be supplied into the process chamber 201. When the inert gas is supplied into the process chamber 201, the inert gas acts as a purge gas.

An example of the precursor gas may include a silane-based gas containing silicon (Si) as a main element constituting a film formed on the wafer 200. An example of the silane-based gas may include a gas containing Si and halogen, that is, a halosilane-based gas. Halogen includes chlorine (Cl), fluorine (F), bromine (Br), iodine (I), and the like. An example of the halosilane-based gas may include the aforementioned chlorosilane-based gas containing Si and Cl.

Examples of the precursor gas may include chlorosilane-based gases such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, and an octachlorotrisilane ($Si_3Cl_8$, abbreviation: OCTS) gas. One or more of these gases may be used as the precursor gas.

Examples of the precursor gas may include fluorosilane-based gases such as a tetrafluorosilane ($SiF_4$) gas and a difluorosilane ($SiH_2F_2$) gas, bromosilane-based gases such as a tetrabromosilane ($SiBr_4$) gas and a dibromosilane ($SiH_2Br_2$) gas, and iodosilane-based gases such as a tetraiodosilane ($SiI_4$) gas and a diiodosilane ($SiH_2I_2$) gas, in addition to the chlorosilane-based gas. One or more of these gases may be used as the precursor gas.

In addition to the aforementioned gases, an example of the precursor gas may include a gas containing Si and an amino group, that is, an aminosilane-based gas. The amino group is a monovalent functional group obtained by removing hydrogen (H) from ammonia, primary amine or secondary amine and may be expressed as $-NH_2$, $-NHR$, or $-NR_2$. Further, R represents an alkyl group, and two R's of $-NR_2$ may be the same or different.

Examples of the precursor gas may include aminosilane-based gases such as a tetrakis(dimethylamino)silane ($Si[N(CH_3)_2]_4$, abbreviation: 4DMAS) gas, a tris(dimethylamino)silane ($Si[N(CH_3)_2]_3H$, abbreviation: 3DMAS) gas, a bis(diethylamino)silane ($Si[N(C_2H_5)_2]_2H_2$, abbreviation: BDEAS) gas, a bis(tert-butylamino)silane ($SiH_2[NH(C_4H_9)]_2$, abbreviation: BTBAS) gas, and a (diisopropylamino)silane ($SiH_3[N(C_3H_7)_2]$, abbreviation: DIPAS) gas. One or more of these gases may be used as the precursor gas.

[Step c2]

After the step c1 is completed, the reaction gas as the second gas is supplied to the wafer 200 in the process chamber 201, that is, the Si-containing layer formed on the wafer 200.

Specifically, the valve 244d is opened to allow the reaction gas to flow through the gas supply pipe 244a. A flow rate of the reaction gas is regulated by the MFC 244c, and the reaction gas is supplied into the process chamber 201 via the common gas supply pipe 242, the gas supply pipe 241, the shower head buffer chamber 232, and the gas supplier 234 (the through-holes 234b) and is exhausted via the exhaust pipe 262. In this operation, the reaction gas is supplied to the wafer 200 (reaction gas supply). At this time, the valves 246d and 247d may be opened to allow an inert gas to be supplied from each of the gas supply pipes 246a and 247a into the process chamber 201. At this time, the reaction gas may be supplied after being excited into a plasma state by the RPU 244e. In this case, the reaction gas excited into the plasma state by the RPU 244e is supplied to the wafer 200 in the process chamber 201 via the common gas supply pipe 242, the gas supply pipe 241, the shower head buffer chamber 232, and the gas supplier 234 (the through-holes 234b).

Processing conditions in the step c2 are exemplified as follows.

Processing temperature: 50 to 1,000 degrees C., specifically 300 to 800 degrees C. in some embodiments Processing pressure: 10 to 3,000 Pa, specifically 20 to 1,000 Pa in some embodiments Reaction gas supply flow rate: 0.0001 to 100 slm, specifically 0.001 to 10 slm in some embodiments Reaction gas supply time: 0.1 to 120 seconds, specifically 1 to 60 seconds, more specifically 1 to 30 seconds in some embodiments High-frequency power (plasma power): 10 to 1,000 W High frequency: 400 KHz to 60 MHz Other processing conditions may be the same as those of processing conditions as in the step c1. The high-frequency power and the high frequency are conditions under which plasma is generated when the reaction gas is supplied with being excited into the plasma state by the RPU 244e.

By supplying the reaction gas, for example, a nitrogen (N)- and hydrogen (H)-containing gas, to the wafer 200 under the aforementioned processing conditions, at least a portion of the Si-containing layer formed on the wafer 200 is nitrided (modified). As a result, a silicon nitride layer (SiN layer) is formed as a layer containing Si and N on the outermost surface of the wafer 200 as a base. When the SiN layer is formed, impurities such as Cl contained in the Si-containing layer form a gaseous substance containing at least Cl during modification reaction of the Si-containing layer by using the N- and H-containing gas, and discharged from the inside of the process chamber 201. As a result, the SiN layer becomes a layer having fewer impurities such as Cl than those of the Si-containing layer formed in the step c1.

After the SiN layer is formed, the valve 244d is closed to stop the supply of the reaction gas into the process chamber 201. Then, a gas or the like remaining in the process chamber 201 is removed from the inside of the process chamber 201 (purge) according to the same processing procedure as the purge in the step c1.

An example of the reaction gas may include a nitriding gas (nitriding agent or nitrogen source). An example of the nitriding gas may include the aforementioned N- and H-containing gas. The N- and H-containing gas is both a N-containing gas and a H-containing gas. The N- and H-containing gas may contain a N—H bond in some embodiments.

Examples of the reaction gas may include hydrogen nitride-based gases such as an ammonia ($NH_3$) gas, a diazene ($N_2H_2$) gas, a hydrazine ($N_2H_4$) gas, and a $N_3H_8$ gas. One or more of these gases may be used as the reaction gas.

In addition to the aforementioned gases, an example of the reaction gas may include a nitrogen (N)-, carbon (C)-, and hydrogen (H)-containing gas. Examples of the N-, C-, and H-containing gas may include an amine-based gas and an organic hydrazine-based gas. The N-, C-, and H-containing gas is a N-containing gas, a C-containing gas, and a H-containing gas. Further, the N-, C-, and H-containing gas is a N- and C-containing gas, a N- and H-containing gas, and a C- and H-containing gas.

Examples of the reaction gas may include ethylamine-based gases such as a monoethylamine ($C_2H_5NH_2$, abbreviation: MEA) gas, a diethylamine (($C_2H_5)_2NH$, abbreviation: DEA) gas, and a triethylamine (($C_2H_5)_3N$, abbreviation: TEA) gas, methylamine-based gas such as a monomethylamine ($CH_3NH_2$, abbreviation: MMA) gas, a dimethylamine (($CH_3)_2NH$, abbreviation: DMA) gas, and a trimethylamine (($CH_3)_3N$, abbreviation: TMA) gas, organic hydrazine-based gases such as a monomethylhydrazine (($CH_3)HN_2H_2$, abbreviation: MMH) gas, a dimethylhydrazine (($CH_3)_2N_2H_2$, abbreviation: DMH) gas, and a trimethylhydrazine (($CH_3)_2N_2(CH_3)H$, abbreviation: TMH) gas, and the like. One or more of these gases may be used as the reaction gas.

[Performing Cycle Predetermined Number of Times]

By performing a cycle a predetermined number of times (m times, where m is an integer of 1 or more), the cycle including non-simultaneously, that is, without synchronization, preforming the aforementioned steps c1 and c2, a film having a predetermined thickness, for example, a SiN film having a predetermined thickness, may be formed on the surface of the wafer 200 as a base. The above cycle may be performed a plurality of times in some embodiments. That is, a thickness of the SiN layer formed per cycle is made thinner than a desired film thickness, and the aforementioned cycle may be performed a plurality of times until a film thickness of a SiN film formed by laminating the SiN layers reaches the desired film thickness in some embodiments. When the N-, C-, and H-containing gas is used as the reaction gas, for example, a silicon carbonitride layer (SiCN layer) may be formed by the aforementioned cycle, and a film, for example, a silicon carbonitride film (SiCN film), may be formed on the surface of the wafer 200 by performing the aforementioned cycle a predetermined number of times.

(After-Purge)

After the process of forming the SiN film having the desired thickness on the wafer 200 is completed, an inert gas as a purge gas is supplied into the process chamber 201 from each of the gas supply pipes 246a, 247a, and 245a and is exhausted via the exhaust pipe 262. As a result, the interior of the process chamber 201 is purged to remove a gas, reaction by-products, and the like remaining in the process chamber 201 from the inside of the process chamber 201 (after-purge). Then, the internal atmosphere of the process chamber 201 is substituted with the inert gas (inert gas substitution).

(Substrate Cooling Step: Step h)

Subsequently, the third gas is supplied from the third gas supply system 258 into the buffer space 233.

Specifically, the valve 258d is opened to allow the third gas to flow through the gas supply pipe 258a. A flow rate of the third gas is regulated by the MFC 258c, and the third gas is supplied into the buffer space 233 and is then supplied to the processed wafer 200 via the through-holes 234a and the process chamber 201.

Processing conditions in the step h are exemplified as follows.

Processing temperature: 50 to 650 degrees C., specifically 20 to 300 degrees C. in some embodiments Processing pressure: 10 to 13,333 Pa, specifically 100 to 10,000 Pa in some embodiments Third gas supply flow rate: 0.0001 to 100 slm, specifically 0.001 to 10 slm in some embodiments Third gas supply time: 0.1 to 300 seconds, specifically 1 to 60 seconds in some embodiments By supplying the third gas to the processed wafer 200 under the aforementioned processing conditions, the processed wafer 200 may be cooled in the process container 202, that is, in the process chamber 201.

Further, in the step h, the processed wafer 200 may be cooled in a state where the substrate mounting stand 212 is lowered to mount the processed wafer 200 on the lift pins 207 such that the processed wafer 200 and the substrate mounting stand 212 are separated from each other. For example, in the step h, the processed wafer 200 may be cooled in a state where the substrate mounting stand 212 is lowered to the wafer transfer position. Further, for example, in the step h, the processed wafer 200 may be cooled in a state where the substrate mounting stand 212 is held at a position at which the processed wafer 200 and the substrate mounting stand 212 may be separated from each other, between the wafer processing position and the wafer transfer position. In this case, by separating the processed wafer 200 and the substrate mounting stand 212 from each other, heat conduction from the substrate mounting stand 212 heated by the heater 213 to the processed wafer 200 may be blocked, whereby it possible to further improve a cooling efficiency of the wafer 200.

(Substrate Unloading Step)

Subsequently, the substrate mounting stand 212 is lowered to the wafer transfer position, the processed wafer 200 is delivered from the substrate mounting stand 212 to the lift pins 207, and the processed wafer 200 is mounted on the lift pins 207. As a result, the processed wafer 200 may be held on the lift pins 207 in the transfer space 203. When the substrate mounting stand 212 is lowered to the wafer transfer position in the step h, this operation is performed in the step h. After the internal pressures of the process chamber 201 and the transfer space 203 are regulated to a predetermined pressure, the gate valve 205 is opened. Then, the processed wafer 200 mounted on the lift pins 207 is unloaded out of the transfer space 203 by the transfer mechanism 500 in the transfer space 203. That is, the processed wafer 200 is transferred from the inside of the transfer space 203 into the transfer chamber 600 by the transfer mechanism 500.

(3) Effects of the Present Embodiment

According to the embodiments, one or more effects set forth below may be achieved.

(a) By performing the step d of lowering the temperature of the gas supplier 234 by supplying the third gas having the temperature lower than that of the heated first gas to the gas supplier 234 between the step b and the step c, it is possible to cool the gas supplier 234 heated in the step b, thereby preventing the second gas supplied in the step c from being excessively heated by the gas supplier 234. As a result, in the step c, it is possible to prevent unexpected decomposition and the like from occurring due to a change in reaction characteristics of the second gas, which makes it possible to improve a process uniformity for each wafer.

In the step b, by pre-heating the wafer 200 before the step c, it is possible to shorten the time taken until the temperature of the wafer 200 reaches the processing temperature in the step c. As a result, it is possible to shorten the processing time, thereby increasing a throughput and hence improving a productivity.

(b) In the step b, by heating the wafer 200 from both the front and rear sides, it is possible to increase a temperature rise rate of the wafer 200, which makes it possible to shorten the pre-heating time of the wafer 200. Further, by heating the wafer 200 from both the front and rear surfaces, it is possible to reduce a temperature difference between the front surface and the rear surface of the wafer 200, which make it possible to prevent the wafer 200 from warping due to the temperature difference between the front surface and the rear surface of the wafer 200.

In the step b, in a state where the wafer 200 is held on the lift pins 207, by heating the wafer 200 from the rear surface side by radiation from the heater 213 installed at the substrate mounting stand 212, radiation from the substrate mounting stand 212 heated by the heater 213, and the like, it is possible to prevent a rapid temperature rise on the rear surface side of the wafer 200, whereby it possible to reduce the temperature difference between the front surface and the rear surface of the wafer 200. As a result, it is possible to prevent the wafer 200 from warping due to the temperature difference between the front surface and the rear surface of the wafer 200, that is, the temperature on the rear surface side being higher than the temperature on the front surface side of the wafer 200.

By performing the step b in a state where the wafer 200 is held on the lift pins 207, since the temperature difference between the front surface and the rear surface of the wafer 200 may be regulated to be small, it is possible to prevent the wafer 200 from warping due to the temperature difference between the front surface and the rear surface of the wafer 200. Specifically, in the step b, for example, by raising or lowering the substrate mounting stand 212 with respect to the fixed lift pins 207 by using the elevator 218, it is possible to regulate a positional relationship between the wafer 200 on the lift pins 207 and the substrate mounting stand 212 (the heater 213), that is, a distance between the wafer 200 and the substrate mounting stand 212. As a result, it is possible to finely regulate the temperature on the rear surface side of the wafer 200, whereby it possible to finely control a temperature balance between the front surface and the rear surface of the wafer 200.

(c) Before the step c, by holding the wafer 200 in a state where the wafer 200 is mounted on the substrate mounting stand 212 and performing the step e of heating the wafer 200 from the rear surface side by the heat conduction from the substrate mounting stand 212 heated by the heater 213, it is possible to directly heat the wafer 200, which makes it possible to further shorten the pre-heating time.

(d) In the step b, by heating the gas supplier 234 by radiation from the heater 213 installed at the substrate mounting stand 212, radiation from the substrate mounting stand 212 heated by the heater 213, radiation from the heated wafer 200, and the like, it is possible to prevent deterioration of film characteristics of a film formed on the wafer 200 and interface characteristics at an interface between the film and the wafer 200 in the step c. Specifically, for example, in the step b, when the wafer 200 is heated, a gas (for example, a $H_2O$ gas) desorbed from the wafer 200 may be adsorbed on the gas supplier 234. In this case, in the step c, this gas may be desorbed from the gas supplier 234 and may be supplied to the wafer 200, which causes deterioration of the film characteristics of the film formed on the wafer 200 and the interface characteristics at an interface between the film and the wafer 200. Further, a gas desorbed from the gas supplier 234 at the initial stage of the step c affects the interface characteristics at the interface between the wafer 200 and the film formed on the wafer 200, and a gas desorbed from the gas supplier 234 after the initial stage of the step c affects the film characteristics of the film formed on the wafer 200. By heating the gas supplier 234 as described above in the step b, it is possible to prevent the gas desorbed from the wafer 200 from being adsorbed on the gas supplier 234, whereby it possible to prevent the deterioration of the aforementioned film characteristics and interface characteristics.

Further, in the step b, the gas supplier 234 may be heated by the first gas supplied from the first gas supply system 248 and heated by the heater 248e, whereby in the step c, it is possible to further prevent the deterioration of the film characteristics of the film formed on the wafer 200 and the interface characteristics at the interface between the film and the wafer 200. That is, by heating the gas supplier 234 as described above in the step b, it is possible to prevent the gas desorbed from the wafer 200 from being adsorbed on the gas supplier 234, which makes it possible to prevent the deterioration of the aforementioned film characteristics and interface characteristics.

(e) Before the step a, by performing the step f of heating the gas supplier 234 by radiation from the heater 213 installed at the substrate mounting stand 212, radiation from the substrate mounting stand 212 heated by the heater 213, and the like, the gas supplier 234 may be heated in advance, and it possible to prevent a gas desorbed from the wafer 200 due to the heating of the wafer 200 at the initial stage of the step b from being adsorbed on the gas supplier 234.

In addition, in the step f, the gas supplier 234 may be heated by the first gas supplied from the first gas supply system 248 and heated by the heater 248e, and furthermore, the gas supplier 234 may also be heated by the fourth gas supplied from the fourth gas supply system 259 and heated by the heater 259e. Therefore, it is possible to prevent the gas desorbed from the wafer 200 due to the heating of the wafer 200 at the initial stage of the step b from being adsorbed on the gas supplier 234.

(f) The distance (distance A) between the gas supplier 234 and the substrate mounting stand 212 in the step f may be made smaller (shorter) than the distance (distance B) between the gas supplier 234 and the substrate mounting stand 212 in the step c, whereby the heating time of the gas supplier 234 may be shortened. That is, by making the distance A shorter than the distance B, the heating efficiency of the gas supplier 234 due to the radiation from the heater 213 in the substrate mounting stand 212, the radiation from the substrate mounting stand 212 heated by the heater 213, and the like may be improved, whereby it possible to shorten a temperature rise time of the gas supplier 234. Further, in the step f, since the substrate mounting stand 212 is maintained in a state of being heated by the heater 213, it is possible to prevent the temperature of the substrate mounting stand 212 from changing suddenly even when the heat of the substrate mounting stand 212 is taken away by the gas supplier 234.

(g) In the step d, by supplying the third gas to the gas supplier 234 from the third gas supply system 258 different from the first gas supply system 248, the third gas unheated may be efficiently supplied to the gas supplier 234, whereby it possible to shorten the cooling time of the gas supplier 234.

(h) In the step d, by supplying the third gas to the gas supplier 234 without going through the first gas supply system 248, the third gas unheated may be efficiently supplied to the gas supplier 234, whereby it possible to shorten the cooling time of the gas supplier 234.

(i) In the step d, by maintaining the temperature state of the heater 248e set to a predetermined temperature in the step b, it is possible to keep a state where the heated first gas may be stably supplied under the same conditions. As a result, for example, when continuous processing is performed on the wafer 200, it is possible to quickly and stably supply the heated first gas under the same conditions as needed.

(j) In the step b, the heated first gas supplied into the buffer space 233 is supplied to the wafer 200 via the buffer space 233. In the step d, the unheated third gas supplied into the buffer space 233 is exhausted via the exhaust pipe 263 installed at the gas supplier 234 without being supplied to the wafer 200. As a result, in the step d, it is possible to avoid the wafer 200 from being cooled, while the buffer space 233 (the gas supplier 234) is being cooled.

(k) Between the step a and the step b, in a state where the wafer 200 is accommodated in the transfer space 203, by performing the step g of heating the wafer 200 by supplying the heated fourth gas to the wafer 200, a timing of starting pre-heating of the wafer 200 may be made faster, whereby it possible to shorten the heating time of the wafer 200.

(i) After the step c, by performing the step h of cooling the wafer 200 by supplying the third gas to the wafer 200, it is possible to cool the wafer 200 in the process container 202 after the film-forming process. As a result, the time taken for the temperature of the processed wafer 200 to reach a temperature at which the processed wafer 200 may be transferred may be shortened, whereby it possible to unload the processed wafer 200 quickly from the inside of the process container 202 (the transfer space 203) after the film-forming process. Further, in the step h, the processed wafer 200 may be cooled in a state where the substrate mounting stand 212 is lowered to mount the processed wafer 200 on the lift pins 207 such that the processed wafer 200 and the substrate mounting stand 212 are separated from each other. This makes it possible to further improve the cooling efficiency of the wafer 200.

(m) By using the inert gas as the first gas and the third gas and using the processing gas (reactive gas) as the second gas, it is possible to prevent the occurrence of unexpected decomposition and the like due to the processing gas heated by the gas supplier 234 in the step c, whereby it possible to improve the film thickness uniformity for each wafer.

(4) Modifications

The configuration of the substrate processing apparatus 100 in the embodiments may be changed as in the following modifications described below.

(First Modification)

Figure 3:
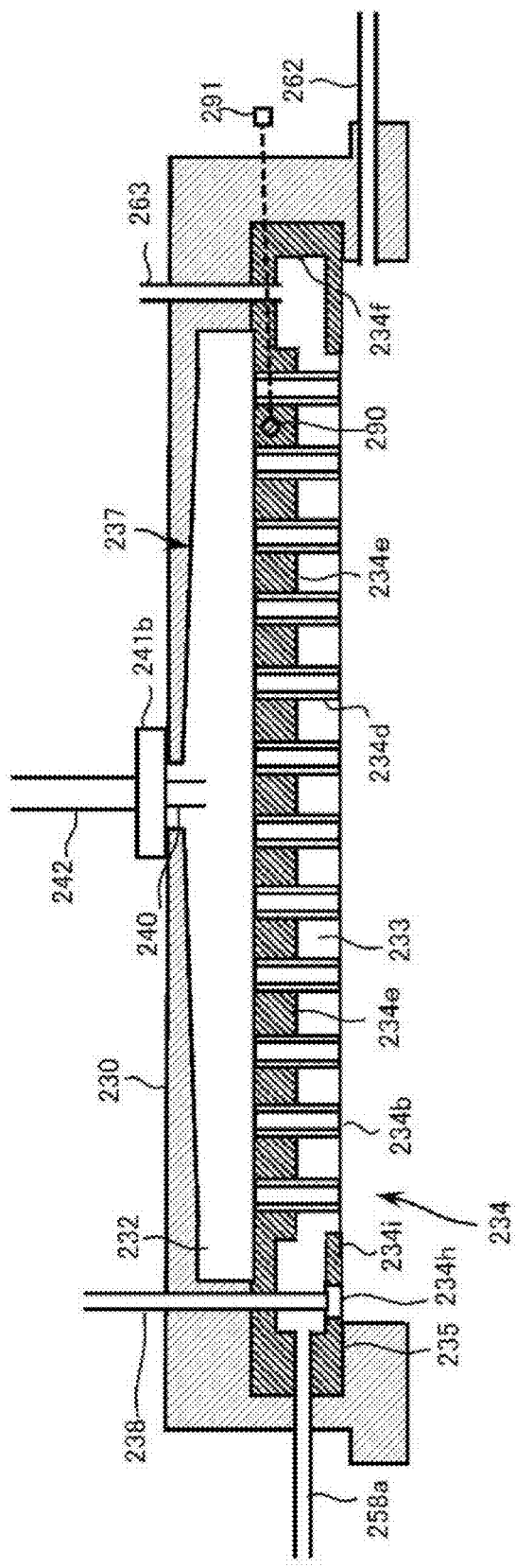
FIG. 3 is a schematic configuration view of a main part of a substrate processing apparatus suitably used in a first modification of the present disclosure.

FIG. 3 is a schematic configuration view of a main part of the substrate processing apparatus 100 in a first modification. Unless otherwise stated, a configuration of the substrate processing apparatus 100 in the first modification is the same as the configuration of the substrate processing apparatus 100 in the aforementioned embodiments. Constituent elements having the same function and configuration are denoted by the same reference numerals, and explanation thereof will not be repeated.

The substrate processing apparatus in the first modification shown in FIG. 3 is different from the substrate processing apparatus 100 in the aforementioned embodiments mainly in the following three points. The gas supply pipe 241 in the aforementioned embodiments is configured such that the leading end 241a is disposed while being exposed to the inside of the shower head buffer chamber 232, whereas a gas guide 237 is connected to a downstream end of a gas supply pipe 240 in the first modification. Further, the plurality of through-holes 234a in the aforementioned embodiments are provided to be adjacent to the through-holes 234b, whereas a plurality of through-holes 234h in the first modification are circumferentially formed at a structure 235 circumferentially placed at a lower wall 234i of the gas supplier 234. Further, the gas supply pipe 236 in the aforementioned embodiments is configured so that the downstream end of the gas supply pipe 236 is connected to the gas introduction hole formed at the upper wall 234e of the gas supplier 234, whereas a gas supply pipe 238 in the first modification is configured such that a downstream end of the gas supply pipe 238 is connected to the structure 235.

Specifically, as shown in FIG. 3, the gas guide 237 configured to guide the second gas supplied from the gas supply pipe 240 into the through-holes 234b is connected to the downstream end of the gas supply pipe 240 in the first modification. In this way, the gas supply pipe 240 is in fluid communication with the through-holes 234b via the gas guide 237. The second gas supplied from the gas supply pipe 240 is supplied into the through-holes 234b via the gas guide 237 and is supplied to the wafer 200 via the through-holes 234b.

Further, as shown in FIG. 3, the structure 235 configured to supply the first gas (heating gas), which is supplied from the gas supply pipe 238, into the through-holes 234h without being discharged into the buffer space 233 is connected to the downstream end of the gas supply pipe 238. In this way, the gas supply pipe 238 is in fluid communication with the through-holes 234h via the structure 235. The first gas (heating gas) supplied from the gas supply pipe 238 is supplied into the through-holes 234h via the structure 235 and is supplied to the wafer 200 via the inside of the through-holes 234h.

In this way, by separating a supply route of the second gas and a supply route of the heated first gas without sharing them, it is possible to prevent the supply route of the second gas from being heated by the heated first gas. This makes it possible to shorten the processing time of the step d.

Further, the plurality of through-holes 234h are only formed circumferentially at the structure 235 circumferentially placed at the lower wall 234i of the gas supplier 234, and the number of through-holes 234h formed near a central side of the wafer 200 differs from the number of through-holes 234h formed near an outer peripheral side of the wafer 200. Specifically, the number of through-holes 234h formed near the outer peripheral side of the wafer 200 is larger than the number of through-holes 234h formed near the central side of the wafer 200. With such a configuration, the heated first gas is supplied more toward the outer peripheral side of the wafer 200 than toward the central side of the wafer 200. Further, the first gas (heating gas) supplied to the outer peripheral side of the wafer 200 may diffuse and then reach the central side of the wafer 200, such that the temperature of the first gas supplied to the outer peripheral side of the wafer 200 is likely to be higher than the temperature of the first gas supplied to the central side of the wafer 200. In general, in the substrate mounting stand 212, because heat is conducted from the outer peripheral side of the substrate mounting stand 212 toward the wall of the process container 202, the temperature on the outer peripheral side of the substrate mounting stand 212 tends to be lower than the temperature on the central side of the substrate mounting stand 212. When the wafer 200 is heated in this state, a temperature difference may occur between the central side and the outer peripheral side of the wafer 200, which may cause a warp in the wafer 200. However, since the temperature of the first gas supplied to the outer peripheral side of the wafer 200 is higher than the temperature of the first gas supplied to the central side of the wafer 200, a wafer in-plane temperature may be made uniform, whereby it possible to prevent the wafer 200 from warping. Further, the through-holes 234h may be formed near the central side of the wafer 200. The aforementioned effects may be obtained by making the number of through-holes 234h near the outer peripheral side of the wafer 200 larger than the number of through-holes 234h near the central side of the wafer 200. Further, the aforementioned effects may be obtained when sizes of the through-holes 234h near the outer peripheral side of the wafer 200 are made larger than sizes of the through-holes 234h near the central side of the wafer 200.

Further, in the modification, the same effects as those of the aforementioned embodiments may be obtained.

[Other Embodiments of the Present Disclosure]

The embodiments of the present disclosure have been described above in detail. However, the present disclosure is not limited to the aforementioned embodiments, but may be variously modified without departing from the gist of the present disclosure.

Figure 4:
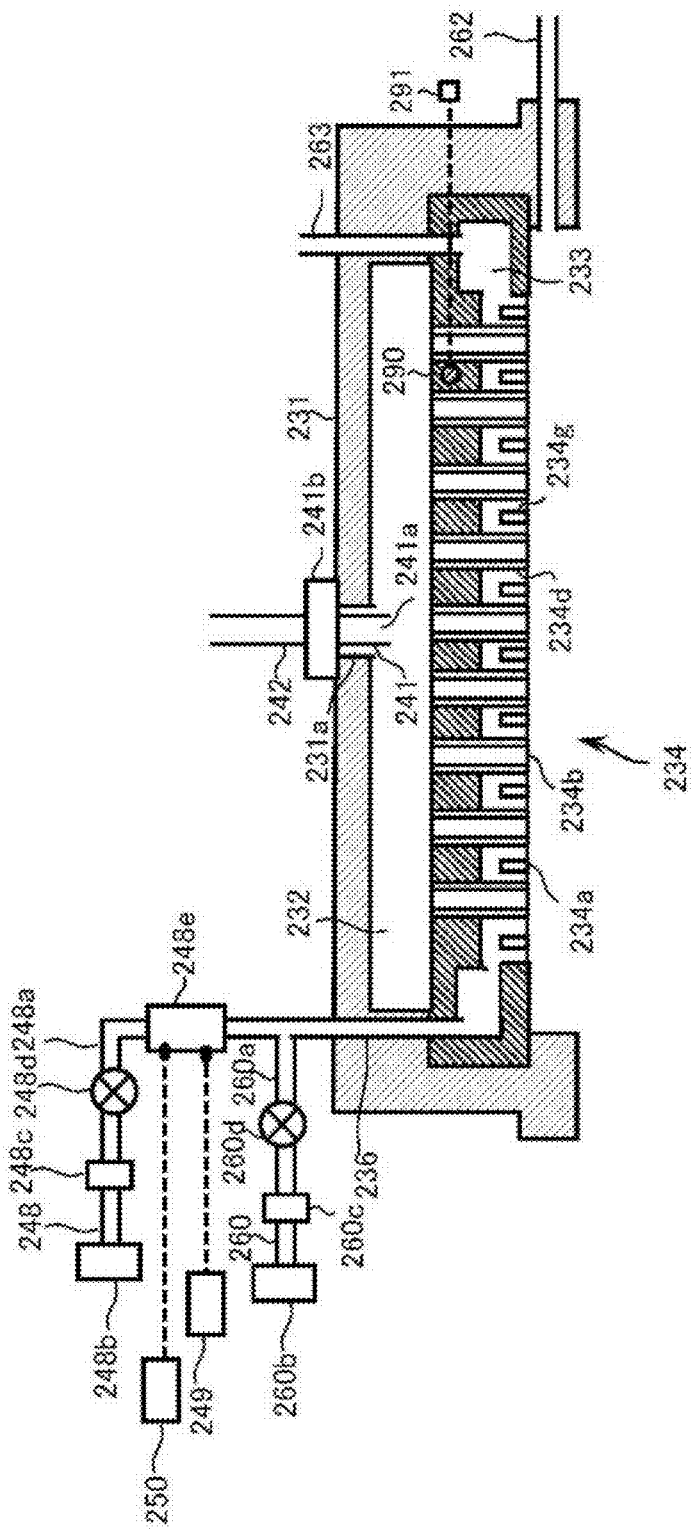
FIG. 4 is a schematic configuration view of a main part of a substrate processing apparatus suitably used in other embodiments of the present disclosure.

The examples in which the third gas supply system 258 and the first gas supply system 248 are completely independent from each other and the third gas is supplied to the gas supplier 234 without going through the first gas supply system 248 have been described in the aforementioned embodiments. However, the present disclosure is not limited thereto. For example, as shown in FIG. 4, the third gas supply system 260 may be connected to the gas supply pipe 236 (the first gas supply system 248), such that the third gas may be supplied from the third gas supply system 260 to the gas supplier 234 via the first gas supply line. Even in such a case, at least some of the effects described in the aforementioned embodiments can be obtained.

In the aforementioned embodiments, various processes have been described without specifically limiting the gas types of the first gas and the third gas. For example, the same gas, that is, the same type of gas, may be used as the first gas and the third gas. That is, gases having the same molecular structure may be used as the first gas and the third gas. For example, when an inert gas is used as the first gas and the third gas, the same inert gas, that is, the inert gas having the same molecular structure may be used. As a result, gas substitution in the process container 202 may be easily performed, thereby improving a throughput. Further, different gases, that is, different types of gases, may be used as the first gas and the third gas. That is, gases having different molecular structures may be used as the first gas and the third gas. For example, when an inert gas is used as the first gas and the third gas, different inert gases, that is, inert gases having different molecular structures, may be used. As a result, an appropriate gas may be selected as the first gas and the third gas according to a goal, thereby increasing a degree of freedom of processing in each step.

The cases where, for example, an inert gas is used as the first gas have been described in the aforementioned embodiments. In those cases, it has also been described that, for example, the rare gases such as the $N_2$ gas, the Ar gas, the He gas, the Ne gas, and the Xe gas may be used as the inert gas. It has also been described that the $H_2$ gas may be used as the first gas.

Among those gases, at least one selected from the group of the $N_2$ gas, the $H_2$ gas, and the He gas as the first gas may be used in some embodiments. These gases have relatively high thermal conductivities, and by using such gases having the high thermal conductivities as the first gas, it is possible to shorten the heating time, that is, the temperature rise time, of the wafer 200 in the step g, the step b, and the step e and further make the in-plane temperature distribution of the wafer 200 more uniform in a shorter time. Further, the thermal conductivities of these gases is higher in the order of $H_2$ gas, He gas, and $N_2$ gas (the thermal conductivity of $H_2$ gas is the highest), and among these gases, the thermal conductivities of $H_2$ gas and He gas are much higher than the thermal conductivity of $N_2$ gas. From these facts, when considering the thermal conductivity, at least one selected from the group of $H_2$ gas and He gas may be used as the first gas in some embodiments. When at least one selected from the group of $H_2$ gas and He gas is used as the first gas, the temperature rise time of the wafer 200 in the step g, the step b, and the step e can be further shortened as compared with when the $N_2$ gas is used as the first gas, whereby it possible to make the in-plane temperature distribution of the wafer 200 more uniform in a shorter time.

Further, by using a reducing gas such as a $H_2$ gas as the first gas, it is possible not only to shorten the temperature rise time of the wafer 200 in the step g, the step b, and the step e but also to effectively remove impurities such as natural oxide films formed on the surface of the wafer 200 and organic substances existing on the surface of the wafer 200. That is, by using the reducing gas such as the $H_2$ gas as the first gas, it is possible to perform pre-treatment, specifically pre-cleaning, on the wafer 200 before the film-forming process. Thus, it possible to improve the interface characteristics at the interface between the wafer 200 and the film formed on the wafer 200, which can result in improvement of electrical characteristics. Further, in the step f, by supplying the reducing gas such as the $H_2$ gas as the first gas into the process chamber 201 via the buffer space 233, it is also possible to remove contaminants such as organic substances adhering to the inside of the buffer space 233 and the inside of the process chamber 201 to clean the interior of the buffer space 233 and the interior of the process chamber 201. When performing such processes, the reducing gas such as the $H_2$ gas may be activated, for example, excited into a plasma state to be supplied, and in this case, it is possible to enhance the effects by each of the aforementioned processes.

Further, the cases where, for example, an inert gas is used as the third gas have been described in the aforementioned embodiments. In those cases, it has also been described that, for example, the rare gases such as the $N_2$ gas, the Ar gas, the He gas, the Ne gas, and the Xe gas may be used as the inert gas. It has also been described that the $H_2$ gas may be used as the third gas.

Among these gases, at least one selected from the group of the $N_2$ gas, the $H_2$ gas, and the He gas as the third gas in some embodiments. These gases have relatively high thermal conductivities, and by using such gases having the high thermal conductivities as the third gas, it is possible to shorten the cooling time of the gas supplier 234 in the step d. Further, it is possible to shorten the cooling time of the wafer 200 in the step h. When considering the thermal conductivity, at least one selected from the group of $H_2$ gas and He gas as the third gas in some embodiments. When at least one selected from the group of $H_2$ gas and He gas is used as the third gas, the cooling time of the gas supplier 234 in the step d may be further shortened as compared with when the $N_2$ gas is used as the third gas. Further, when at least one selected from the group of $H_2$ gas and He gas is used as the third gas, the cooling time of the wafer 200 in the step h may be further shortened as compared with when the $N_2$ gas is used as the third gas.

Further, by using a reducing gas such as the $H_2$ gas as the third gas, it is possible not only to shorten the cooling time of the wafer 200 in the step h but also to effectively remove impurities remaining on the surface and the like of a film formed on the wafer 200. That is, by using the reducing gas such as the $H_2$ gas as the third gas, it is also possible to perform post-treatment on the wafer 200 after the film-forming process. Thus, it possible to improve the film characteristics of the film formed on the wafer 200, which can result in improvement of the electrical characteristics. Further, in this case, the reducing gas such as the $H_2$ gas may be activated, for example, excited into a plasma state to be supplied, and in this case, it is possible to enhance the effects by the aforementioned processes.

The cases where, for example, the inert gas is used as the fourth gas have been described in the aforementioned embodiments. In those cases, it has also been described that, for example, the rare gases such as the $N_2$ gas, the Ar gas, the He gas, the Ne gas, and the Xe gas may be used as the inert gas. It has also been described that the $H_2$ gas may be used as the fourth gas.

Among these gases, at least one selected from the group of the $N_2$ gas, the $H_2$ gas, and the He gas may be used as the fourth gas. These gases have relatively high thermal conductivities, and by using such gases having the high thermal conductivities as the fourth gas, it is possible to shorten the heating time, that is, the temperature rise time, of the wafer 200 in the step g, the step b, and the step e and further make the in-plane temperature distribution of the wafer 200 more uniform in a shorter time. When considering the thermal conductivity, at least one selected from the group of $H_2$ gas and He gas may be used as the fourth gas in some embodiments. When at least one selected from the group of $H_2$ gas and He gas is used as the fourth gas, the temperature rise time of the wafer 200 in the step g, the step b, and the step e may be further shortened as compared with when the $N_2$ gas is used as the fourth gas, whereby it possible to make the in-plane temperature distribution of the wafer 200 more uniform in a shorter time.

Further, by using the reducing gas such as the $H_2$ gas as the fourth gas, it is possible not only to shorten the temperature rise time of the wafer 200 in the step g, the step b, and the step e but also to effectively remove impurities such as natural oxide films formed on the surface of the wafer 200 and organic substances existing on the surface of the wafer 200. That is, by using the reducing gas such as the $H_2$ gas as the fourth gas, it is possible to perform pre-treatment, specifically pre-cleaning, on the wafer 200 before the film-forming process. This makes it possible to improve the interface characteristics at the interface between the wafer 200 and the film formed on the wafer 200, which can result in improvement of the electrical characteristics. Further, in the step f, by supplying the reducing gas such as the $H_2$ gas as the fourth gas into the process chamber 201 via the buffer space 233, it is also possible to remove contaminants such as organic substances adhering to the inside of the buffer space 233 and the inside of the process chamber 201 to clean the interior of the buffer space 233 and the interior of the process chamber 201. When performing such processes, the reducing gas such as the $H_2$ gas may be activated, for example, excited into a plasma state, to be supplied, and in this case, it is possible to enhance the effects by each of the aforementioned processes.

The examples in which the plurality of through-holes 234*a* and 234*b* are formed have been described in the aforementioned embodiments. However, the present disclosure is not limited thereto. For example, only one through-hole 234*a* and only one through-hole 234*b* may be formed. Even in such a case, at least some of the effects described in the aforementioned embodiments may be obtained.

Further, the examples in which the silane-based gas is mainly used as the precursor gas have been described in the aforementioned embodiments. However, the present disclosure is not limited thereto. For example, by using a precursor gas containing a metal element such as aluminum (Al), titanium (Ti), hafnium (Hf), zirconium (Zr), tantalum (Ta), molybdenum (Mo), and tungsten (W), a film containing a metal element, such as an aluminum nitride film (AlN film), a titanium nitride film (TiN film), a hafnium nitride film (HfN film), a zirconium nitride film (ZrN film), a tantalum nitride film (TaN film), a molybdenum nitride film (MoN film), a tungsten nitride film (WN film), an aluminum oxide film (AlO film), a titanium oxide film (TiO film), a hafnium oxide film (HfO film), a zirconium oxide film (ZrO film), a tantalum oxide film (TaO film), a molybdenum oxide film (MoO film), a tungsten oxide film (WO film), a titanium oxynitride film (TiON film), a titanium aluminum carbonitride film (TiAlCN film), a titanium aluminum carbide film (TiAlC film), or a titanium carbonitride film (TiCN film), may be formed on a substrate according to the aforementioned film-forming sequence. Even in such a case, at least some of the effects described in the aforementioned embodiments may be obtained.

Further, the examples in which the silicon nitride film is formed by using the nitriding gas as the reaction gas have been described in the aforementioned embodiments. However, the present disclosure is not limited thereto. For example, by using an O-containing gas such as an $O_2$ gas or a C-containing gas such as a propylene ($C_3H_6$) gas as the reaction gas, a film containing Si, such as a silicon oxide film (SiO film), a silicon carbide film (SiC film), or a silicon oxycarbide film (SiOC film), may be formed on the substrate according to the aforementioned film-forming sequence. Even in such a case, at least some of the effects described in the aforementioned embodiments may be obtained.

The examples in which the temperature of the gas supplier 234 is regulated according to the processing conditions including the supply flow rate, the supply time, and the temperature of the gas set in advance without measuring the temperature of the gas supplier 234 have been described in the aforementioned embodiments. However, the present disclosure is not limited thereto. For example, as shown in FIG. 1, a thermocouple 290 may be buried in the gas supplier 234 such that the temperature of the gas supplier 234 may be measured by a temperature measuring part 291 connected to the thermocouple 290. With this configuration, the temperature of the gas supplier 234 may be measured, and each part may be feedback-controlled based on the measured temperature data. Such feedback control makes it possible to precisely control the temperature of the gas supplier 234. Further, such a control makes it possible to suppress a temperature regulation time from being prolonged due to occurrence of an overshoot in the temperature of the gas supplier 234, and the like.

Figure 5:
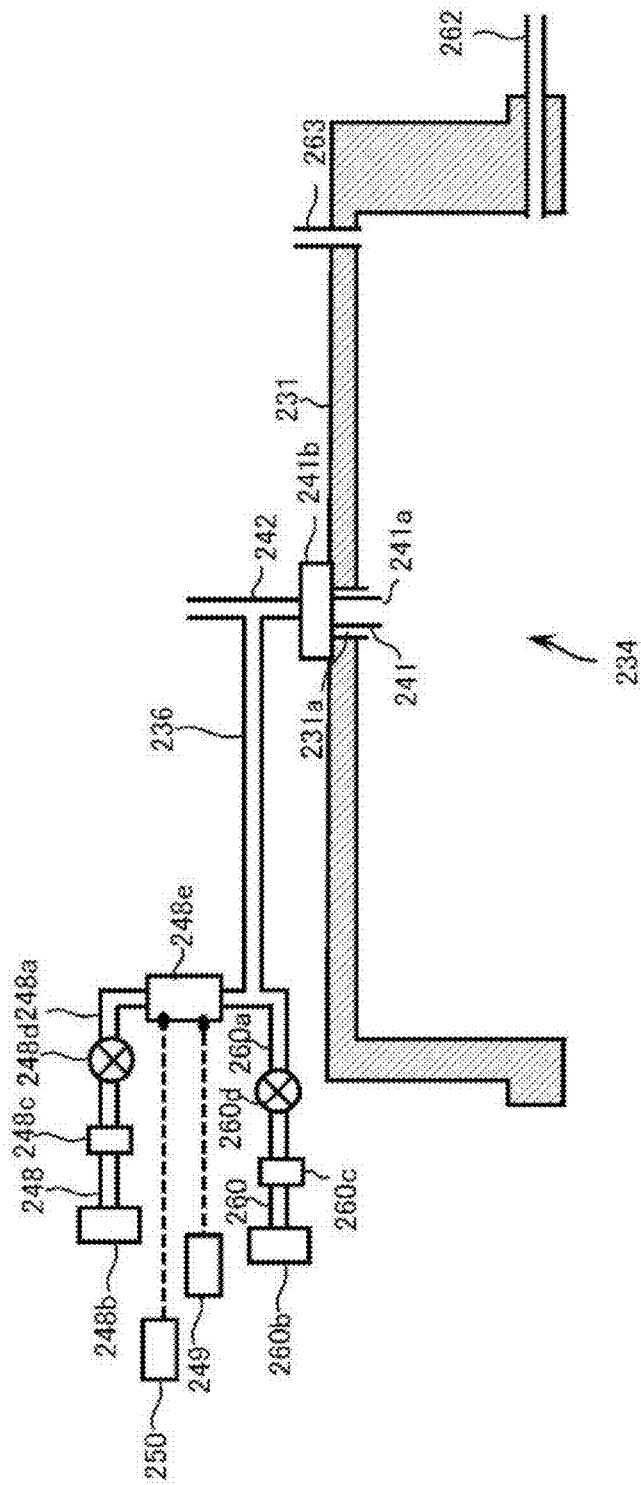
FIG. 5 is a schematic configuration view of a main part of a substrate processing apparatus suitably used in other embodiments of the present disclosure.

The configuration in which one or more selected from the group of the heated inert gas, the reducing gas, and the gas having the high thermal conductivity may be supplied into the buffer space 233 has been described in the aforementioned embodiments. However, the present disclosure is not limited to this configuration. For example, as shown in FIG. 5, the gas supply pipe 236 may be connected to the common gas supply pipe 242. With such a configuration, at least some of the effects described in the aforementioned embodiments can be obtained. In addition, the structure of the substrate processing apparatus may be simplified, which makes it possible to facilitate maintenance and reduce apparatus costs.

The cases in which the film-forming process is performed have been described in the aforementioned embodiments. However, the present disclosure is not limited thereto. For example, a part of the aforementioned embodiments may be applied to a case of cleaning the interior of the process container 202. When cleaning, without loading a product wafer 200 into the process container 202, for example, the step g, the step b, and the step d may be performed before the cleaning process, and the step h may be performed after the cleaning process. In the cleaning process, a F-containing gas such as a fluorine ($F_2$) gas may be supplied as a cleaning gas from the gas supply pipe 245a. Even in this case, at least some of the effects described in the aforementioned embodiments may be obtained. By the step d performed before the cleaning process, it is possible to prevent corrosion and cleaning damage of the gas supplier 234. Further, by the step h performed after the cleaning process, it is possible to remove the residual fluorine in the process container 202.

<Aspects of the Present Disclosure>

Hereinafter, some aspects of the present disclosure will be additionally described as supplementary notes.

(Supplementary Note 1)

According to some embodiments of the present disclosure, there is provided a method of manufacturing a semiconductor device, including:

(a) loading a substrate into a process container;

(b) heating the substrate by supplying a first gas, which is heated when passing through a first heater installed at a first gas supply line, to the substrate via a gas supplier;

(c) supplying a second gas, which flows through a second gas supply line different from the first gas supply line, to the substrate mounted on a substrate mounting table in the process container, via the gas supplier; and (d) lowering a temperature of the gas supplier by supplying a third gas, which has a temperature lower than that of the first gas, to the gas supplier between (b) and (c).

(Supplementary Note 2)

In the method of Supplementary Note 1, in (b), the substrate is held in a floating state without being mounted on the substrate mounting table, and the substrate is heated from a rear surface of the substrate by a second heater installed at the substrate mounting table.

(Supplementary Note 3)

In the method of Supplementary Note 1 or 2, the method further includes: (e) holding the substrate in a state of being mounted on the substrate mounting table, and heating the substrate from a rear surface by heat conduction from the substrate mounting table heated by a second heater before (c).

(Supplementary Note 4)

In the method of any one of Supplementary Notes 1 to 3, in (b), the gas supplier is heated by a second heater installed at the substrate mounting table.

(Supplementary Note 5)

In the method of any one of Supplementary Notes 1 to 4, the method further includes: (f) heating the gas supplier by a second heater installed at the substrate mounting table before (a).

(Supplementary Note 6)

In the method of Supplementary Note 5, a distance between the gas supplier and the substrate mounting table in (f) is made shorter than a distance between the gas supplier and the substrate mounting table in (c).

(Supplementary Note 7)

In the method of any one of Supplementary Notes 1 to 6, in (d), the third gas is supplied from a third gas supply line different from the first gas supply line to the gas supplier.

(Supplementary Note 8)

In the method of any one of Supplementary Notes 1 to 7, in (d), the third gas is supplied from a third gas supply line different from the first gas supply line to the gas supplier via the first gas supply line.

(Supplementary Note 9)

In the method of any one of Supplementary Notes 1 to 8, in (d), the third gas is supplied from a third gas supply line different from the first gas supply line to the gas supplier without flowing through the first gas supply line.

(Supplementary Note 10)

In the method of any one of Supplementary Notes 1 to 9, in (d), a temperature state of the first heater set to a predetermined temperature in (b) is maintained.

(Supplementary Note 11)

In the method of any one of Supplementary Notes 1 to 10, in (b), the first gas supplied into a buffer space installed at the gas supplier is supplied to the substrate via the buffer space, and in (d), the third gas supplied into the buffer space is exhausted via an exhauster installed at the gas supplier without being supplied to the substrate.

(Supplementary Note 12)

In the method of any one of Supplementary Notes 1 to 11, in (b), the first gas is supplied to the substrate via a first gas supply port installed at the gas supplier and being in fluid communication with the first gas supply line, and in (c), the second gas is supplied to the substrate via a second gas supply port installed at the gas supplier and being in fluid communication with the second gas supply line.

(Supplementary Note 13)

In the method of any one of Supplementary Notes 1 to 12, the method further includes: (g) heating the substrate by supplying a fourth gas, which is heated when passing through a fourth heater installed at a fourth gas supply line, to the substrate in a state where the substrate is accommodated in a transfer chamber installed in the process container between (a) and (b).

(Supplementary Note 14)

In the method of any one of Supplementary Notes 1 to 13, the method further includes: (h) cooling the substrate by supplying the third gas to the substrate after (c).

(Supplementary Note 15)

In the method of any one of Supplementary Notes 1 to 14, the gas supplier is configured to face an upper surface of the substrate, and in (b), a temperature of the first gas supplied to an outer peripheral side of the substrate is made higher than a temperature of the first gas supplied to a central side of the substrate.

(Supplementary Note 16)

In the method of any one of Supplementary Notes 1 to 15, supply ports configured such that the first gas passes through the supply ports and is supplied to the substrate are installed at the gas supplier, and in (b), the first gas is supplied to the substrate via the gas supplier configured such that at least one selected from the group of the number of the supply ports and sizes of the supply ports near a central side of the substrate is different from that near an outer peripheral side of the substrate.

(Supplementary Note 17)

In the method of any one of Supplementary Notes 1 to 16, in (b), at least one selected from the group of a $N_2$ gas, a $H_2$ gas, and a He gas is used as the first gas.

(Supplementary Note 18)

In the method of any one of Supplementary Notes 14 to 17, in (h), at least one selected from the group of a $N_2$ gas, a $H_2$ gas, a He gas, a diluted $H_2$ gas, and an activated $H_2$ gas is used as the third gas.

(Supplementary Note 19)

In the method of any one of Supplementary Notes 1 to 18, an inert gas is used as the first gas and the third gas, and a processing gas (a reactive gas) is used as the second gas.

(Supplementary Note 20)

In the method of any one of Supplementary Notes 1 to 19, the first gas and the third gas are the same gas (the gas having the same type and the same molecular structure).

(Supplementary Note 21)

According to other embodiments of the present disclosure, there is provided a substrate processing apparatus including:

a process container in which a substrate is accommodated;

a transfer mechanism configured to transfer the substrate into the process container;

a substrate mounting table configured to mount the substrate in the process container;

a gas supplier configured to supply a gas to the substrate in the process container;

a first gas supply line including a first heater and being configured to supply a first gas via the gas supplier;

a second gas supply line configured to supply a second gas via the gas supplier;

a third gas supply line configured to supply a third gas to the gas supplier; and a controller configured to be capable of controlling the transfer mechanism, the first gas supply line, the second gas supply line, and the third gas supply line to perform each process (each step) of Supplementary Note 1 in the process container.

(Supplementary Note 22)

According to other embodiments of the present disclosure, there is provided a program that causes, by a computer, a substrate processing apparatus to perform each process (each step) of Supplementary Note 1 or a computer-readable storage medium storing the program.

According to the present disclosure in some embodiments, it is possible to improve a processing uniformity and a throughput for each substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   (a) loading a substrate into a process container;
   (b) heating the substrate by supplying a first gas, which is heated when passing through a first heater installed at a first gas supply line, to the substrate via a gas supplier;
   (c) supplying a second gas, which flows through a second gas supply line different from the first gas supply line, to the substrate mounted on a substrate mounting table in the process container, via the gas supplier; and
   (d) lowering a temperature of the gas supplier by supplying a third gas, which has a temperature lower than that of the first gas, to the gas supplier between (b) and (c).

2. The method of claim 1, wherein in (b), the substrate is held in a floating state without being mounted on the substrate mounting table, and the substrate is heated from a rear surface of the substrate by a second heater installed at the substrate mounting table.

3. The method of claim 1, further comprising: (e) holding the substrate in a state of being mounted on the substrate mounting table, and heating the substrate from a rear surface by heat conduction from the substrate mounting table heated by a second heater before (c).

4. The method of claim 1, wherein in (b), the gas supplier is heated by a second heater installed at the substrate mounting table.

5. The method of claim 1, further comprising: (f) heating the gas supplier by a second heater installed at the substrate mounting table before (a).

6. The method of claim 5, wherein a distance between the gas supplier and the substrate mounting table in (f) is made shorter than a distance between the gas supplier and the substrate mounting table in (c).

7. The method of claim 1, wherein in (d), the third gas is supplied from a third gas supply line different from the first gas supply line to the gas supplier.

8. The method of claim 1, wherein in (d), the third gas is supplied from a third gas supply line different from the first gas supply line to the gas supplier via the first gas supply line.

9. The method of claim 1, wherein in (d), the third gas is supplied from a third gas supply line different from the first gas supply line to the gas supplier without flowing through the first gas supply line.

10. The method of claim 1, wherein in (d), a temperature state of the first heater set to a predetermined temperature in (b) is maintained.

11. The method of claim 1, wherein in (b), the first gas supplied into a buffer space installed at the gas supplier is supplied to the substrate via the buffer space, and
wherein in (d), the third gas supplied into the buffer space is exhausted via an exhauster installed at the gas supplier without being supplied to the substrate.

12. The method of claim 1, wherein in (b), the first gas is supplied to the substrate via a first gas supply port installed at the gas supplier and being in fluid communication with the first gas supply line, and
wherein in (c), the second gas is supplied to the substrate via a second gas supply port installed at the gas supplier and being in fluid communication with the second gas supply line.

13. The method of claim 1, further comprising: (g) heating the substrate by supplying a fourth gas, which is heated when passing through a fourth heater installed at a fourth gas supply line, to the substrate in a state where the substrate is accommodated in a transfer chamber installed in the process container between (a) and (b).

14. The method of claim 1, further comprising: (h) cooling the substrate by supplying the third gas to the substrate after (c).

15. The method of claim 14, wherein in (h), at least one selected from the group of a $N_2$ gas, a $H_2$ gas, a He gas, a diluted $H_2$ gas, and an activated $H_2$ gas is used as the third gas.

16. The method of claim 1, wherein the gas supplier is configured to face an upper surface of the substrate, and
wherein in (b), a temperature of the first gas supplied to an outer peripheral side of the substrate is made higher than a temperature of the first gas supplied to a central side of the substrate.

17. The method of claim 1, wherein supply ports configured such that the first gas passes through the supply ports and is supplied to the substrate are installed at the gas supplier, and
wherein in (b), the first gas is supplied to the substrate via the gas supplier configured such that at least one selected from the group of the number of the supply ports and sizes of the supply ports near a central side of the substrate is different from that near an outer peripheral side of the substrate.

18. The method of claim 1, wherein in (b), at least one selected from the group of a $N_2$ gas, a $H_2$ gas, and a He gas is used as the first gas.

19. The method of claim 1, wherein an inert gas is used as the first gas and the third gas, and a processing gas is used as the second gas.

20. The method of claim 1, wherein the first gas and the third gas are the same gas.

21. A substrate processing method, comprising:
(a) loading a substrate into a process container;
(b) heating the substrate by supplying a first gas, which is heated when passing through a first heater installed at a first gas supply line, to the substrate via a gas supplier;
(c) supplying a second gas, which flows through a second gas supply line different from the first gas supply line, to the substrate mounted on a substrate mounting table in the process container, via the gas supplier; and
(d) lowering a temperature of the gas supplier by supplying a third gas, which has a temperature lower than that of the first gas, to the gas supplier between (b) and (c).

22. A substrate processing apparatus, comprising:
a process container in which a substrate is accommodated;
a transfer mechanism configured to transfer the substrate into the process container;
a substrate mounting table configured to mount the substrate in the process container;
a gas supplier configured to supply a gas to the substrate in the process container;
a first gas supply line including a first heater and being configured to supply a first gas via the gas supplier;
a second gas supply line configured to supply a second gas via the gas supplier;
a third gas supply line configured to supply a third gas to the gas supplier; and
a controller configured to be capable of controlling the transfer mechanism, the first gas supply line, the second gas supply line, and the third gas supply line to perform a process in the process container, the process comprising:
(a) loading the substrate into the process container;
(b) heating the substrate by supplying the first gas, which is heated when passing through the first heater installed at the first gas supply line, to the substrate via the gas supplier;
(c) supplying the second gas, which flows through the second gas supply line different from the first gas supply line, to the substrate mounted on the substrate mounting table in the process container, via the gas supplier; and
(d) lowering a temperature of the gas supplier by supplying the third gas, which has a temperature lower than that of the first gas, to the gas supplier between (b) and (c).

23. A non-transitory computer-readable recording medium storing a program that causes, by a computer, a substrate processing apparatus to perform a process in a process container of the substrate processing apparatus, the process comprising:
(a) loading a substrate into the process container;
(b) heating the substrate by supplying a first gas, which is heated when passing through a first heater installed at a first gas supply line, to the substrate via a gas supplier;
(c) supplying a second gas, which flows through a second gas supply line different from the first gas supply line, to the substrate mounted on a substrate mounting table in the process container, via the gas supplier; and (d) lowering a temperature of the gas supplier by supplying a third gas, which has a temperature lower than that of the first gas, to the gas supplier between (b) and (c).

* * * * *